(12) United States Patent
Choi et al.

(10) Patent No.: US 10,231,367 B2
(45) Date of Patent: Mar. 12, 2019

(54) ELECTRONIC DEVICE HAVING STRUCTURE FOR SHIELDING MAGNETIC FORCE

(71) Applicant: Samsung Electronics Co., Ltd., Suwon-si, Gyeonggi-do (KR)

(72) Inventors: Seungki Choi, Suwon-si (KR); Yongseok Lee, Seoul (KR); Seungjun Park, Suwon-si (KR); Jungsik Park, Suwon-si (KR); Soyoung Lee, Gwacheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/688,065

(22) Filed: Aug. 28, 2017

(65) Prior Publication Data

US 2018/0070482 A1   Mar. 8, 2018

(30) Foreign Application Priority Data

Sep. 7, 2016   (KR) .......................... 10-2016-0115287

(51) Int. Cl.
  *H05K 9/00*      (2006.01)
  *H05K 5/00*      (2006.01)
  (Continued)

(52) U.S. Cl.
  CPC ............... *H05K 9/002* (2013.01); *H04R 9/02* (2013.01); *H05K 5/0017* (2013.01);
  (Continued)

(58) Field of Classification Search
  CPC .... H05K 5/0017; H05K 9/002; H05K 1/0216; H05K 2201/10371; H04N 5/2257;
  (Continued)

(56) References Cited

U.S. PATENT DOCUMENTS 5,107,540 A * 4/1992 Mooney .................. B06B 1/045
                                                   340/407.1
2014/0301578 A1* 10/2014 Lee ......................... H04R 1/021
                                                   381/122

(Continued)

FOREIGN PATENT DOCUMENTS

KR   10-2015-0081109 A   7/2015

*Primary Examiner* — James Wu
(74) *Attorney, Agent, or Firm* — Jefferson IP Law, LLP

(57) ABSTRACT

An electronic device including a structure to shield magnetic force is provided. The electronic device includes a housing having a first surface facing a first direction, a second surface facing a second direction opposite to the first direction, and a side member for enclosing a portion of a space between the first surface and the second surface, a first electronic component positioned inside the housing and including magnets positioned to emit a magnetic flux in the first direction or the second direction, a second electronic component positioned inside the housing and including a magnet for emitting a magnetic flux in the first direction or the second direction and being positioned beside one side surface of the first electronic component in a substantially vertical direction to the first direction or the second direction, and a shield structure is positioned between the first electronic component and the second electronic component.

20 Claims, 17 Drawing Sheets

(51) Int. Cl.
*H04R 9/02* (2006.01)
*H04R 31/00* (2006.01)

(52) U.S. Cl.
CPC ......... *H05K 9/0075* (2013.01); *H04R 31/006* (2013.01); *H04R 2209/022* (2013.01); *H04R 2499/11* (2013.01)

(58) Field of Classification Search
CPC . H04N 5/2253; H04N 5/2254; H04M 1/0264; H04M 1/026; H04R 9/10
See application file for complete search history.

(56) References Cited

U.S. PATENT DOCUMENTS

2015/0195439 A1* 7/2015 Miller .................. G02B 27/646
348/208.7
2016/0205304 A1 7/2016 Oh

* cited by examiner

ELECTRONIC DEVICE HAVING STRUCTURE FOR SHIELDING MAGNETIC FORCE

CROSS-REFERENCE TO RELATED APPLICATION(S)

This application claims the benefit under 35 U.S.C. § 119(a) of a Korean patent application filed on Sep. 7, 2016 in the Korean Intellectual Property Office and assigned Serial number 10-2016-0115287, the entire disclosure of which is hereby incorporated by reference.

TECHNICAL FIELD

The present disclosure relates to an electronic device having a structure for shielding a magnetic force. More particularly, the present disclosure relates to an electronic device having a shield structure such that electronic components including a magnet have no influence on another magnet thereof.

BACKGROUND

Electronic devices (e.g., a smart phone) may include various electronic components having a magnet for an operation thereof. For example, a receiver may include a coil and a magnet as an actuator of a vibration plate. Further, a camera may include a coil and a magnet as an actuator for moving a lens.

Nowadays, in order to provide various services in accordance with market demand, various electronic components may be mounted in electronic devices. Accordingly, there is much difficulty in mounting various kinds of electronic components at a limited space of the electronic device. For example, electronic components each including a magnet may be disposed adjacent to an inner space of the electronic device and, in such a case, the magnets have an influence on each other, thus, an error may occur in an operation of a corresponding electronic component.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device that can operate without an error, even if electronic components each including a magnet are adjacently installed.

In accordance with an aspect of the present disclosure, an electronic device is provided. The electronic device includes a housing including a first surface facing a first direction, a second surface facing a second direction opposite to the first direction, and a side member configured to enclose at least a portion of a space between the first surface and the second surface, a first electronic component positioned inside the housing, the first electronic component comprising magnets disposed to emit a magnetic flux in the first direction or the second direction, a second electronic component positioned inside the housing, the second electronic component comprising at least one magnet disposed to emit a magnetic flux in the first direction or the second direction and being disposed beside one side surface of the first electronic component in a substantially vertical direction to the first direction or the second direction, and a shield structure disposed between the first electronic component and the second electronic component. The shield structure includes a first shield structure formed at the one side surface and a second shield structure formed in a substantially vertical direction to the one side surface and disposed not to overlap with at least two of magnets of the first electronic component, when viewed above the second surface.

In accordance with another aspect of the present disclosure, an electronic device is provided. The electronic device includes a housing including a first surface facing a first direction, a second surface facing a second direction opposite to the first direction, and a side member configured to enclose at least a portion of a space between the first surface and the second surface, a receiver positioned inside the housing, a display positioned inside the housing and exposed through at least a portion of the first surface, and a processor positioned inside the housing and electrically connected to the receiver and the display. The receiver includes a coil, a first magnet disposed inside the coil and disposed to emit a magnetic flux in the first direction or the second direction, a second magnet disposed outside the coil, a third magnet disposed outside the coil to be symmetric to the second magnet, and a shield structure made of a conductive material. The shield structure includes a first shield structure formed in the first direction or the second direction and a second shield structure extended from the first shield structure in a substantially vertical direction to the first direction or the second direction and disposed not to overlap with the coil and the magnets, when viewed above the second surface.

In accordance with another aspect of the present disclosure, an electronic device is provided. The electronic device includes a receiver including an actuator, a plurality of magnets for driving the actuator, a first surface facing a first direction, and a second surface facing a second direction vertical to the first direction, and a shield structure including a first shield structure formed in at least a portion of the first surface of the receiver and a second shield structure formed in at least a portion of the second surface, the second shield structure being extended from the first shield structure. The second shield structure is overlapped with one magnet adjacent to the first surface among the plurality of magnets or disposed not to overlap with the plurality of magnets, when viewed above the second surface in the second direction.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
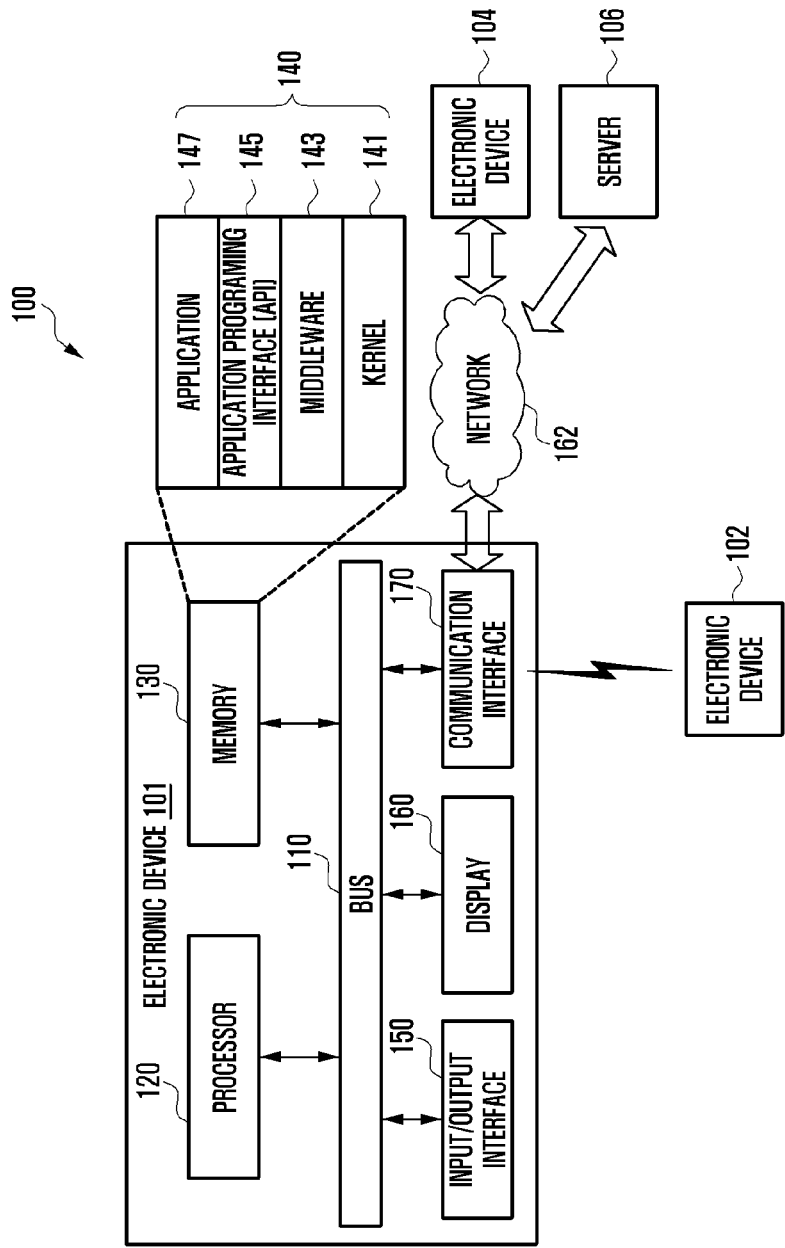
FIG. 1 is a block diagram illustrating a configuration of an electronic device in a network environment according to various embodiments of the present disclosure.

The following description with reference to the accompanying drawings is provided to assist in a comprehensive understanding of various embodiments of the present disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include" or "may include" which may be used in describing various embodiments of the present disclosure refers to the existence of a corresponding disclosed function, operation or component which can be used in various embodiments of the present disclosure and does not limit one or more additional functions, operations, or components. In various embodiments of the present disclosure, the terms such as "include" or "have" may be construed to denote a certain characteristic, number, operation, constituent element, component or a combination thereof, but may not be construed to exclude the existence of or a possibility of the addition of one or more other characteristics, numbers, operations, constituent elements, components or combinations thereof.

In various embodiments of the present disclosure, the expression "or" or "at least one of A or/and B" includes any or all of combinations of words listed together. For example, the expression "A or B" or "at least A or/and B" may include A, may include B, or may include both A and B.

The expression "1", "2", "first", or "second" used in various embodiments of the present disclosure may modify various components of the various embodiments but does not limit the corresponding components. For example, the above expressions do not limit the sequence and/or importance of the components. The expressions may be used for distinguishing one component from other components. For example, a first user device and a second user device may indicate different user devices although both of them are user devices. Similarly, without departing from the scope of the present disclosure, a first structural element may be referred to as a second structural element. The second structural element also may be referred to as the first structural element.

When it is stated that a component is "coupled to" or "connected to" another component, the component may be directly coupled or connected to another component or a new component may exist between the component and another component. In contrast, when it is stated that a component is "directly coupled to" or "directly connected to" another component, a new component does not exist between the component and another component.

The terms used in describing various embodiments of the present disclosure are only examples for describing a specific embodiment but do not limit the various embodiments of the present disclosure.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present description.

An electronic device according to various embodiments of the present disclosure may be a device including a communication function. For example, the electronic device may be one or a combination of a smart phone, a tablet personal computer (PC), a mobile phone, a video phone, an e-book reader, a desktop PC, a laptop PC, a netbook computer, a personal digital assistant (PDA), a camera, and a wearable device (e.g., a head-mounted-device (HMD) such as electronic glasses, electronic clothes, an electronic bracelet, an electronic necklace, an electronic accessory, an electronic tattoo, and a smart watch).

According to some embodiments of the present disclosure, the electronic device may be a smart home appliance having a communication function. The smart home appliance may include at least one of a television (TV), a digital versatile disc (DVD) player, an audio player, an air conditioner, a cleaner, an oven, a microwave oven, a washing machine, an air cleaner, a set-top box, a TV box (e.g., Samsung HomeSync™, Apple TV™, or Google TV™), game consoles, an electronic dictionary, an electronic key, a camcorder, and an electronic frame.

According to some embodiments, the electronic device may include at least one of various types of medical devices (e.g., magnetic resonance angiography (MRA), magnetic resonance imaging (MRI), computed tomography (CT), a scanner, an ultrasonic device and the like), a navigation device, a global navigation satellite system (GNSS) receiver, an event data recorder (EDR), a flight data recorder (FDR), a vehicle infotainment device, electronic equipment for a ship (e.g., a navigation device for ship, a gyro compass and the like), avionics, a security device, a head unit for a vehicle, an industrial or home robot, an automatic teller machine (ATM) of financial institutions, a point of sale (POS) device of shops, and a device for Internet of things (IoT) (e.g., a fire alarm, various sensors, electric or gas meter units, a sprinkler, a thermostat, a streetlamp, a toaster, sport outfits, a hot-water tank, a heater, a boiler and the like).

According to some embodiments of the present disclosure, the electronic device may include at least one of furniture or a part of a building/structure, an electronic board, an electronic signature receiving device, a projector, and various types of measuring devices (e.g., a water meter, an electricity meter, a gas meter, a radio wave meter and the like) including a camera function. The electronic device according to various embodiments of the present disclosure may be one or a combination of the above described various devices. Further, the electronic device according to various embodiments of the present disclosure may be a flexible device. It is apparent to those skilled in the art that the electronic device according to various embodiments of the present disclosure is not limited to the above described devices.

Hereinafter, an electronic device according to various embodiments of the present disclosure will be described with reference to the accompanying drawings. The term "user" used in various embodiments may refer to a person who uses an electronic device or a device (e.g., an artificial intelligence electronic device) which uses an electronic device.

FIG. 1 illustrates a network environment 100 including an electronic device 101 according to various embodiments of the present disclosure.

Referring to FIG. 1, the electronic device 101 may include various components including a bus 110, a processor 120, a memory 130, an input/output interface 150, a display 160, and a communication interface 170.

The bus 110 may be a circuit connecting the above described components and transmitting communication (e.g., a control message) between the above described components.

The processor 120 may receive commands from other components (e.g., the memory 130, the input/output interface 150, the display 160, or the communication interface 170) through the bus 110, analyze the received commands, and execute calculation or data processing according to the analyzed commands.

The memory 130 stores commands or data received from the processor 120 or other components (e.g., the input/output interface 150, the display 160, or the communication interface 170) or generated by the processor 120 or other components. The memory 130 may store a software and/or a program 140. For example, the program 140 may include a kernel 141, middleware 143, an application programming interface (API) 145, and an application program (or an application) 147. At least part of the kernel 141, the middleware 143 or the API 145 may refer to an operating system (OS).

The kernel 141 controls or manages system resources (e.g., the bus 110, the processor 120, or the memory 130) used for executing an operation or function implemented by the remaining other programming modules, for example, the middleware 143, the API 145, or the application 147. The kernel 141 provides an interface for accessing individual components of the electronic device 101 from the middleware 143, the API 145, or the application 147 to control or manage the components.

The middleware 143 performs a relay function of allowing the API 145 or the application 147 to communicate with the kernel 141 to exchange data. In operation requests received from the application 147, the middleware 143 performs a control for the operation requests (e.g., scheduling or load balancing) by using a method of assigning a priority, by which system resources (e.g., the bus 110, the processor 120, the memory 130 and the like) of the electronic device 101 can be used, to the application 147.

The API 145 is an interface by which the application 147 can control a function provided by the kernel 141 or the middleware 143 and includes, for example, at least one interface or function (e.g., command) for a file control, a window control, image processing, or a character control.

The application 147 may include a short message service (SMS)/multimedia messaging service (MMS) application, an email application, a calendar application, an alarm application, a health care application (e.g., application measuring quantity of exercise or blood sugar) or an environment information application (e.g., application providing information on barometric pressure, humidity or temperature). The application 147 may be an application related to an information exchange between the electronic device 101 and an external electronic device (e.g., second external electronic device 104). The application 147 related to the information exchange may include, for example, a notification relay application for transferring particular information to the external electronic device or a device management application for managing the external electronic device.

For example, the notification relay application may include a function of transmitting notification information generated by another application (e.g., an SMS/MMS application, an email application, a health care application or an environment information application) of the electronic device 101 to the external electronic device (e.g., second external electronic device 104). The notification relay application may receive notification information from, for example, the second external electronic device 104, and provide the received notification information to the user. The device management application may manage (e.g., install, remove, or update) at least a part of functions of the electronic device. For example, the device management application may turn on/off the external electronic device (or some components of the external electronic device), control a brightness of the display of the external electronic device or communicate with the electronic device 101, an application executed in the second external electronic device 104, or a service (e.g., call service or message service) provided by the second external electronic device 104.

The application 147 may include an application designated according to an attribute (e.g., type of electronic device) of the second external electronic device 104. For example, when the second external electronic device 104 is a moving picture experts group (MPEG-1 or MPEG-2) audio layer-3 (MP3) player, the application 147 may include an application related to music reproduction. Similarly, when the second external electronic device 104 is a mobile medical device, the application 147 may include an application related to health care. The application 147 may include at least one of an application designated to the electronic device 101 and an application received from an external electronic device (e.g., a server 106 or the second external electronic device 104).

The input/output interface 150 transmits a command or data input from the user through an input/output device (e.g., a sensor, a keyboard, or a touch screen) to the processor 120, the memory 130, the communication interface 170, or the display 160 through, for example, the bus 110. For example, the input/output interface 150 may provide data on a user's touch input through a touch screen to the processor 120. Further, the input/output interface 150 may output a command or data received through, for example, the bus 110, from the processor 120, the memory 130, or the communication interface 170 through the input/output device (e.g., a speaker or a display). For example, the input/output interface 150 may output voice data processed through the processor 120 to the user through the speaker.

The display 160 may include, for example, liquid crystal display (LCD), flexible display, transparent display, light-emitting diode (LED) display, organic LED (OLED) display, microelectromechanical systems (MEMS) display, or electronic paper display. The display 160 may visually offer, for example, various content (e.g., text, image, video, icon, symbol, etc.) to users. The display 160 may include a touch screen and receive, for example, a touch, gesture, proximity, or hovering input using an electronic pen or a user's body. The display 160 may be one or more displays. For example, the display 160 may be included in the electronic device 101 or included in an external device (e.g., a first external electronic device 102 or the second external electronic device 104) having a wired or wireless connection with the electronic device 101, thus outputting information offered by the electronic device 101 to users.

The display 160 may be attachable to or detachable from the electronic device 101. For example, the display 160 may include an interface which can be mechanically or physically connected with the electronic device 101. In case the display 160 is detached (e.g., separated) from the electronic device 101 by a user's selection, the display 160 may receive various control signals or image data from the processor 120, e.g., through wireless communication.

The communication interface 170 may establish communication between the electronic device 101 and any external device (e.g., the first external electronic device 102, the second external electronic device 104, or the server 106). For example, the communication interface 170 may be connected with a network 162 through wired or wireless communication and thereby communicate with any external device (e.g., the first external electronic device 102, the second external electronic device 104, or the server 106).

The electronic device 101 may be connected with the first external electronic device 102 and the second external electronic device 104 without using the communication interface 170. For example, based on at least one of a magnetic sensor, a contact sensor, a light sensor, and the like that is equipped in the electronic device 101, the electronic device 101 may sense whether at least one of the first and second external electronic devices 102 and 104 is contacted with at least part of the electronic device 101, or whether at least one of the first and second external electronic devices 102 and 104, respectively, is attached to at least part of the electronic device 101.

Wireless communication may use, as cellular communication protocol, at least one of long-term evolution (LTE), LTE-advance (LTE-A), code division multiple access (CDMA), wideband CDMA (WCDMA), universal mobile telecommunications system (UMTS), wireless broadband (WiBro), global system for mobile communications (GSM), and the like. A short-range communication 163 may include, for example, at least one of Wi-Fi, Bluetooth (BT), near field communication (NFC), magnetic secure transmission or near field magnetic data stripe transmission (MST), and GNSS, and the like. The GNSS may include at least one of, for example, a global positioning system (GPS), a Glonass, a Beidou navigation satellite system (hereinafter, referred to as "Beidou"), and European global satellite-based navigation system (Galileo). Hereinafter, the "GPS" may be interchangeably used with the "GNSS" in the present disclosure. Wired communication may include, for example, at least one of universal serial bus (USB), high definition multimedia interface (HDMI), recommended standard-232 (RS-232), plain old telephone service (POTS), and the like. The network 162 may include telecommunication network, for example, at least one of a computer network (e.g., local area network (LAN) or wide area network (WAN)), internet, and a telephone network.

The first and second external electronic devices 102 and 104 may be identical to, or different from, the electronic device 101. The first and second external electronic devices 102 and 104 may include, for example, a plurality of electronic devices. The server 106 may include a single server or a group of servers. All or part of operations executed in the electronic device 101 may be executed in other electronic device(s), such as the first and second external electronic devices 102 and 104 or the server 106.

In case the electronic device 101 is required to perform a certain function or service automatically or by request, the electronic device 101 may request another device (e.g., the first external electronic device 102 or the second external electronic device 104 or the server 106) to execute instead, or additionally at least part, of at least one or more functions associated with the required function or service. The requested device may execute the requested function and deliver the result of execution to the electronic device 101. Then, the electronic device 101 may offer the required function or service, based on the received result or by processing the received result. For the above, cloud computing technology, distributed computing technology, or client-server computing technology may be used, for example.

Figure 2:
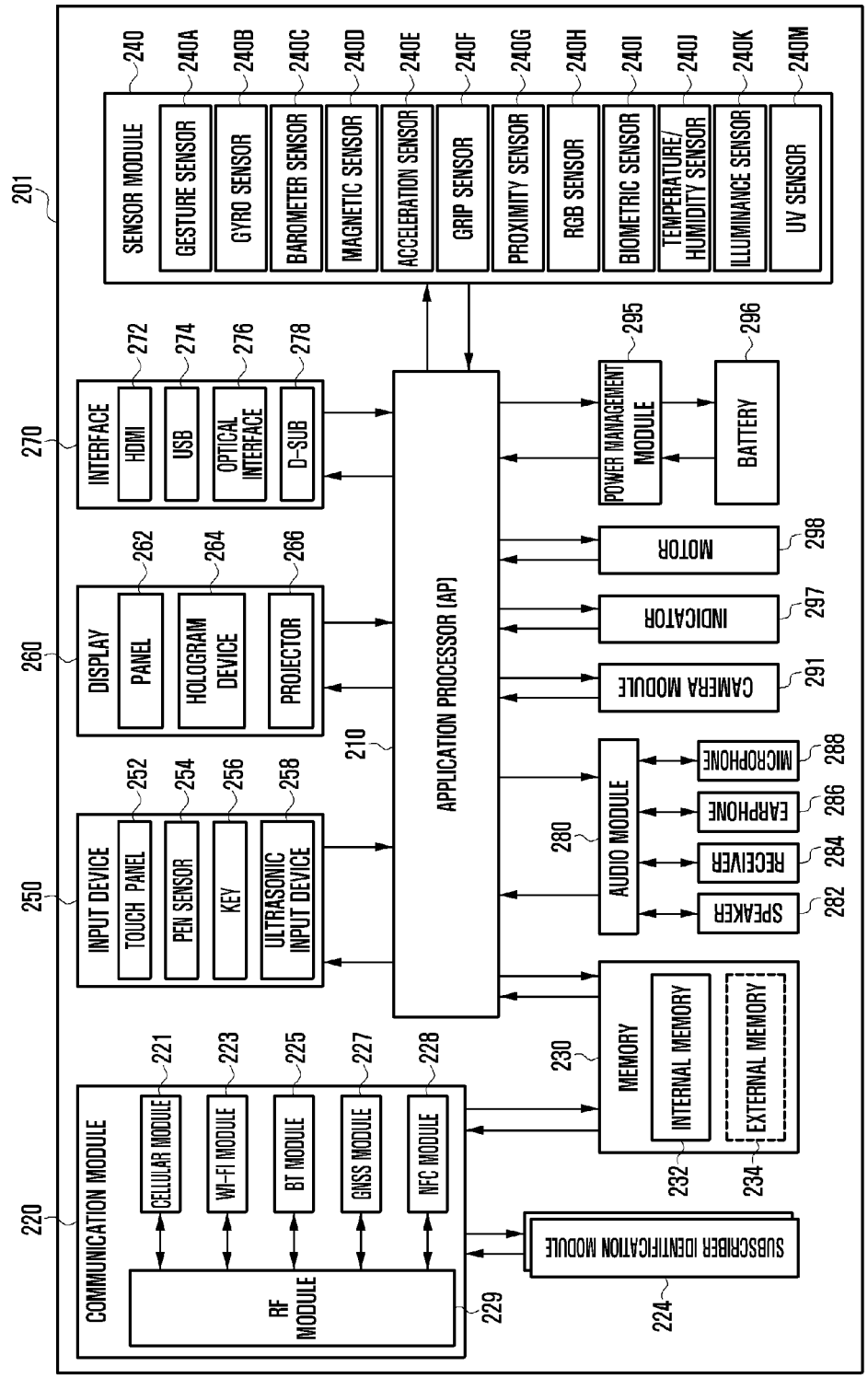
FIG. 2 is a block diagram illustrating a configuration of an electronic device according to various embodiments of the present disclosure.

FIG. 2 is a detailed block diagram showing a configuration of an electronic device according to an embodiment of the present disclosure.

Referring to FIG. 2, for example, the electronic device 201 is capable of including part or all of the components in the electronic device 101 shown in FIG. 1. The electronic device 201 is capable of including one or more processors (i.e., processor 210) (e.g., application processors (APs)), a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 is capable of driving, for example, an OS or an application program to control a plurality of hardware or software components connected to the processor 210, processing various data, and performing operations. The processor 210 may be implemented as, for example, a system on chip (SoC). The processor 210 may further include a graphic processing unit (GPU) and/or an image signal processor (ISP). The processor 210 may also include at least part of the components shown in FIG. 2, e.g., a cellular module 221. The processor 210 is capable of loading commands or data received from at least one of other components (e.g., a non-volatile memory) on a volatile memory, processing the loaded commands or data. The processor 210 is capable of storing various data in a non-volatile memory.

The communication module 220 may include the same or similar configurations as the communication interface 170 shown in FIG. 1. For example, the communication module 220 is capable of including the cellular module 221, a Wi-Fi module 223, a BT module 225, a GNSS module 227 (e.g., a GPS module, Glonass module, Beidou module or Galileo module), an NFC module 228, and a radio frequency (RF) module 229.

The cellular module 221 is capable of providing a voice call, a video call, an SMS service, an Internet service, etc., through a communication network, for example. The cellular module 221 is capable of identifying and authenticating the electronic device 201 in a communication network by using the SIM 224 (e.g., a SIM card). The cellular module 221 may be capable of performing at least part of the functions provided by the processor 210. The cellular module 221 may also include a communication processor (CP).

Each of the Wi-Fi module 223, the BT module 225, the GNSS module 227, and the NFC module 228 may include a processor for processing data transmitted or received through the corresponding module. The MST module may include a processor for processing data transmitted or received through the corresponding module. At least part of the cellular module 221, Wi-Fi module 223, BT module 225, GNSS module 227, NFC module 228, and MST module (e.g., two or more modules) may be included in one integrated chip (IC) or one IC package.

The RF module 229 is capable of transmission/reception of communication signals, e.g., RF signals. The RF module 229 may include a transceiver, a power amp module (PAM), a frequency filter, a low noise amplifier (LNA), an antenna, etc. According to another embodiment of the present disclosure, at least one of the following modules cellular module 221, Wi-Fi module 223, BT module 225, GNSS module 226, NFC module 228, and MST module is capable of transmission/reception of RF signals through a separate RF module.

The SIM module 224 may include a card including a SIM and/or an embodied SIM. The SIM module 224 may also contain unique identification information, e.g., integrated circuit card identifier (ICCID), or subscriber information, e.g., international mobile subscriber identity (IMSI).

The memory 230 (e.g., memory 130 shown in FIG. 1) may include a built-in internal memory 232 or an external memory 234. The built-in internal memory 232 may include at least one of the following a volatile memory, e.g., a dynamic random access memory (DRAM), a static RAM (SRAM), a synchronous dynamic RAM (SDRAM), etc., and a non-volatile memory, e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory, an NOR flash memory, etc.), a hard drive, a solid state drive (SSD), etc.

The external memory 234 may include a flash drive, e.g., a compact flash (CF), a secure digital (SD), a micro-SD, a mini-SD, an extreme digital (xD), a multimedia card (MMC), a memory stick, etc. The external memory 234 may be connected to the electronic device 201, functionally and/or physically, through various interfaces.

The memory 230 may store payment information and a payment application serving as one of the application programs. The payment information may refer to credit card numbers and personal identification numbers (PINs), corresponding to a credit card. The payment information may also include user authentication information, e.g., fingerprints, facial features, voice information, etc.

When the payment application is executed by the processor 210, the payment application may enable the processor 210 to perform an interaction with the user to make payment (e.g., displaying a screen to select a card (or a card image) and obtaining information (e.g., a card number) corresponding to a selected card (e.g., a pre-specified card) from payment information), and an operation to control magnetic field communication (e.g., transmitting the card information to an external device (e.g., a card reading apparatus) through the NFC module 228 or MST module). The following description provides detailed embodiments with operations of the components described above.

The sensor module 240 may measure/detect a physical quantity or an operation state of the electronic device 201, and convert the measured or detected information into an electronic signal. The sensor module 240 may include at least one of the following a gesture sensor 240A, a gyro sensor 240B, a barometer sensor 240C, a magnetic sensor 240D, an acceleration sensor 240E, a grip sensor 240F, a proximity sensor 240G, a color sensor 240H (e.g., a red, green, and blue (RGB) sensor), a biometric sensor 240I, a temperature/humidity sensor 240J, an illuminance sensor 240K, and an ultraviolet (UV) sensor 240M. Additionally or alternatively, the sensor module 240 may also include an E-nose sensor, an electromyography (EMG) sensor, an electroencephalogram (EEG) sensor, an electrocardiogram (ECG) sensor, an infrared (IR) sensor, an iris sensor and/or a fingerprint sensor. The sensor module 240 may further include a control circuit for controlling one or more sensors included therein. The electronic device 201 may include a processor, configured as part of the processor 210 or a separate component, for controlling the sensor module 240. In this case, while the processor 210 is operating in sleep mode, the processor may control the sensor module 240.

The input unit 250 may include, for example, a touch panel 252, a digital pen sensor 254, a key 256, or an ultrasonic input device 258. The touch panel 252 may use, for example, at least one of a capacitive type, a resistive type, an infrared type, and an ultrasonic type. The touch panel 252 may further include a control circuit. The touch panel 252 may further include a tactile layer to offer a tactile feedback to a user. The touch panel 252 may include a pressure sensor (or a force sensor) capable of measuring the strength or pressure of a user's touch. This pressure sensor may be formed integrally with or separately from the touch panel 252.

The digital pen sensor 254 may be a part of the touch panel or include a separate sheet for recognition. The key 256 may include, for example, a physical button, an optical key, or a keypad. The ultrasonic input device 258 may detect ultrasonic waves occurring at an input tool through a microphone (e.g., 288) and thereby identify data corresponding to the detected ultrasonic waves.

The display 260 may include a panel 262, a hologram device 264, or a projector 266. The panel 262 may include the same or similar configurations as the display 160 shown in FIG. 1. The panel 262 may be implemented to be flexible, transparent, or wearable. The panel 262 may also be incorporated into one module together with the touch panel 252. The hologram device 264 may show a stereoscopic image in the air by using light interference. The projector 266 may display an image by projecting light onto a screen. The screen may be located inside or outside of the electronic device 201. The display 260 may further include a control circuit for controlling the panel 262, the hologram device 264, or the projector 266.

The interface 270 may include a high-definition multimedia interface (HDMI) 272, a USB 274, an optical interface 276, or a D-subminiature (D-sub) 278. The interface 270 may be included in the communication interface 170 shown in FIG. 1. Additionally or alternatively, the interface 270 may include a mobile high-definition link (MHL) interface, a SD card/MMC interface, or an infrared data association (IrDA) standard interface.

The audio module 280 may provide bidirectional conversion between a sound and an electronic signal. At least part of the components in the audio module 280 may be included in the input/output interface 150 shown in FIG. 1. The audio module 280 may process sound information input or output through a speaker 282, a receiver 284, earphones 286, microphone 288, etc.

The camera module 291 may take both still and moving images. The camera module 291 may include one or more image sensors (e.g., a front image sensor or a rear image sensor), a lens, an ISP, a flash (e.g., an LED or xenon lamp), etc.

The power management module 295 is capable of managing power of the electronic device 201. The power management module 295 may include a power management integrated circuit (PMIC), a charger IC, or a battery or fuel gauge. The PMIC may employ wired charging and/or wireless charging methods. Examples of the wireless charging method are magnetic resonance charging, magnetic induction charging, and electromagnetic charging. To this end, the PIMC may further include an additional circuit for wireless charging, such as a coil loop, a resonance circuit, a rectifier, etc. The battery gauge may measure the residual capacity, charge in voltage, current, or temperature of the battery 296. The battery 296 takes the form of either a rechargeable battery or a solar battery.

The indicator 297 may display a specific status of the electronic device 201 or a part thereof (e.g., the processor 210), e.g., a boot-up status, a message status, a charging status, etc. The motor 298 may convert an electrical signal into mechanical vibrations, such as, a vibration effect, a haptic effect, etc. Although not shown, the electronic device 201 may further include a processing unit (e.g., GPU) for supporting a mobile TV. The processing unit for supporting a mobile TV is capable of processing media data pursuant to standards, e.g., digital multimedia broadcasting (DMB), digital video broadcasting (DVB), or MediaFlo™, etc.

Each of the elements described in the present disclosure may be formed with one or more components, and the names of the corresponding elements may vary according to the type of the electronic device. In various embodiments, the electronic device may include at least one of the above described elements described in the present disclosure, and may exclude some of the elements or further include other additional elements. Further, some of the elements of the electronic device according to various embodiments may be coupled to form a single entity while performing the same functions as those of the corresponding elements before the coupling.

Figure 3:
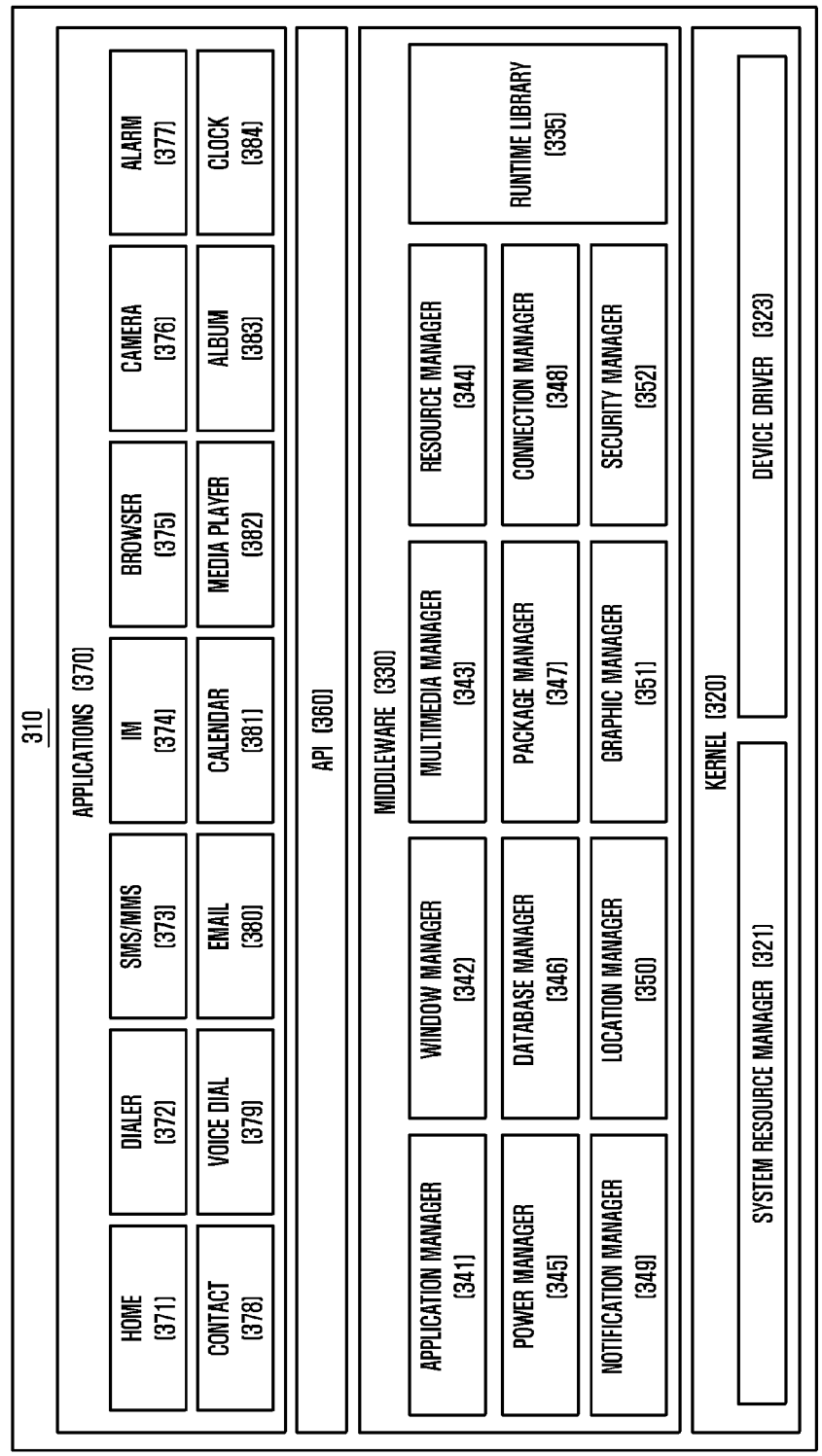
FIG. 3 is a block diagram illustrating a configuration of a program module according to various embodiments of the present disclosure.

FIG. 3 is a block diagram of a programming module according to an embodiment of the present disclosure.

Referring to FIG. 3, the program module 310 (e.g., program 140 shown in FIG. 1) may include an OS for controlling resources related to the electronic device (e.g., electronic device 11) and/or various applications (e.g., application 147 shown in FIG. 1) running on the OS. The OS may be Android, iOS, Windows, Symbian, Tizen, Bada, etc.

The program module 310 may include a kernel 320, middleware 330, API 360 and/or applications 370. At least part of the program module 310 may be preloaded on the electronic device or downloaded from a server (e.g., the first external electronic device 102 or the second external electronic device 104, the server 106, etc.).

The kernel 320 (for example, kernel 14A) may include a system resource manager 321 and/or a device driver 323. The system resource manager 321 may include, for example, a process manager, a memory manager, and a file system manager. The system resource manager 321 may perform a system resource control, allocation, and recall. The device driver 323 may include, for example, a display driver, a camera driver, a BT driver, a shared memory driver, a USB driver, a keypad driver, a Wi-Fi driver, and an audio driver. Further, the device driver 312 may include an inter-process communication (IPC) driver.

The middleware 330 may provide a function required in common by the applications 370. The middleware 330 may provide a function through the API 360 to allow the applications 370 to efficiently use limited system resources within the electronic device. The middleware 330 (for example, the middleware 143) may include at least one of a runtime library 335, an application manager 341, a window manager 342, a multimedia manager 343, a resource manager 344, a power manager 345, a database manager 346, a package manager 347, a connection manager 348, a notification manager 349, a location manager 350, a graphic manager 351, and a security manager 352.

The runtime library 335 may include, for example, a library module used by a compiler to add a new function through a programming language while the applications 370 are executed. According to an embodiment of the present disclosure, the runtime library 335 executes input and output, management of a memory, a function associated with an arithmetic function and the like.

The application manager 341 may manage, for example, a life cycle of at least one of the applications 370. The window manager 342 may manage GUI resources used on the screen. The multimedia manager 343 may detect a format required for reproducing various media files and perform an encoding or a decoding of a media file by using a codec suitable for the corresponding format. The resource manager 344 manages resources such as a source code, a memory, or a storage space of at least one of the applications 370.

The power manager 345 may operate together with a basic input/output system (BIOS) to manage a battery or power and provides power information required for the operation. The database manager 346 may manage generation, search, and change of a database to be used by at least one of the applications 370. The package manager 347 may manage an installation or an update of an application distributed in a form of a package file.

The connection manager 348 may manage, for example, a wireless connection such as Wi-Fi or BT. The notification manager 349 may display or notify a user of an event such as an arrival message, an appointment, a proximity alarm or the like, in a manner that does not disturb the user. The location manager 350 may manage location information of the electronic device. The graphic manager 351 may manage a graphic effect provided to the user or a user interface (UI) related to the graphic effect. The security manager 352 provides a general security function required for a system security or a user authentication. When the electronic device (for example, the electronic device 101) has a call function, the middleware 330 may further include a telephony manager for managing a voice of the electronic device or a video call function.

The middleware 330 may include modules configuring various combinations of functions of the above described components. The middleware 330 may provide modules specialized according to types of operation systems to provide distinct functions. The middleware 330 may be adaptively configured in such a way as to remove part of the existing components or to include new components.

The API 360 (for example, API 145) may be a set of API programming functions, and may be provided with a different configuration according to an OS. For example, in Android or iOS, a single API set may be provided for each platform. In Tizen, two or more API sets may be provided.

The applications 370 (e.g., application 147) may include one or more applications for performing various functions, e.g., home 371, dialer 372, SMS/MMS 373, instant message (IM) 374, browser 375, camera 376, alarm 377, contact 378, voice dial 379, email 380, calendar 381, media player 382, album 383, clock 384, health care (e.g., an application for measuring amount of exercise, blood sugar level, etc.), and environment information (e.g., an application for providing atmospheric pressure, humidity, temperature, etc.).

The applications 370 may include an application for supporting information exchange between an electronic device (e.g., the electronic device 101) and an external device (e.g., the first and second external electronic devices 102 and 104), which is hereafter called 'information exchange application'). The information exchange application is capable of including a notification relay application for relaying specific information to external devices or a device management application for managing external devices.

For example, the notification relay application may include a function for relaying notification information, created in other applications of the electronic device (e.g., SMS/MMS application, email application, health care application, environment information application, etc.) to external devices (e.g., electronic devices 32 and 34). In addition, the notification relay application is capable of receiving notification information from external devices to provide the received information to the user.

The device management application may manage (e.g., install, remove or update) at least one function of an external device (e.g., the first and second external electronic devices 102 and 104) communicating with the electronic device. Examples of the function are a function of turning-on/off the external device or part of the external device, a function of controlling the brightness (or resolution) of the display, applications running on the external device, services provided by the external device, etc. Examples of the services are a call service, messaging service, etc.

The applications 370 may include an application (e.g., a health care application of a mobile medical device, etc.) specified attributes of an external device (e.g., the first and second external electronic devices 102 and 104). The applications 370 may include applications received from an external device (e.g., the server 106, the first and second external electronic devices 102 and 104). The applications 370 may include a preloaded application or third party applications that can be downloaded from a server. It should be understood that the components of the program module 310 may be called different names according to types of OS.

According to various embodiments of the present disclosure, at least part of the program module 310 can be implemented with software, firmware, hardware, or any combination of two or more of them. At least part of the program module 310 can be implemented (e.g., executed) by a processor (e.g., processor 120). At least part of the programing module 310 may include modules, programs, routines, sets of instructions or processes, etc., in order to perform one or more functions.

Various embodiments of the present disclosure provide a handheld electronic device capable of transmitting, to a card reading apparatus, card information carried by magnetic field signals, and thus making payment for costs. Various embodiments of the present disclosure also provide a handheld electronic device capable of making payment for costs, etc., through communication with a card reading apparatus, although the apparatus is not equipped with an NFC module, without modifying the existing solution, as if a magnetic card is used against the apparatus. Therefore, the present disclosure is capable of leading to activating offline mobile payment.

The term 'module' as used in various embodiments of the present disclosure may mean a unit including one of hardware, software, and firmware or any combination of two or more of them. The 'module' may be interchangeable with the term 'unit,' 'logic,' 'logical block,' 'component,' or 'circuit.' The 'module' may be the smallest unit of an integrated component or a part thereof. The 'module' may be the smallest unit that performs one or more functions or a part thereof. The 'module' may be mechanically or electronically implemented. For example, the 'module' according to various embodiments of the present disclosure may include at least one of the following application-specific integrated circuit (ASIC) chips, field-programmable gate arrays (FPGAs), and programmable-logic devices for performing certain operations, which are now known or will be developed in the future.

At least part of the method (e.g., operations) or system (e.g., modules or functions) according to various embodiments of the present disclosure can be implemented with instructions as programming modules that are stored in computer-readable storage media. One or more processors (e.g., processor 120) can execute instructions, thereby performing the functions. An example of the computer-readable storage media may be the memory 130. At least part of the programming modules can be implemented (executed) by a processor. At least part of the programing module may include modules, programs, routines, sets of instructions or processes, etc., in order to perform one or more functions.

Examples of computer-readable media include magnetic media, such as hard disks, floppy disks, and magnetic tape, optical media such as compact disc-ROM (CD-ROM) disks and DVD, magneto-optical media, such as floptical disks, and hardware devices that are specially configured to store and perform program instructions (e.g., programming modules), such as ROM, RAM, flash memory, etc. Examples of program instructions include machine code instructions created by assembly languages, such as a compiler, and code instructions created by a high-level programming language executable in computers using an interpreter, etc. The described hardware devices may be configured to act as one or more software modules in order to perform the operations and methods described above, or vice versa.

Modules or programming modules according to various embodiments of the present disclosure may include one or more components, remove part of them described above, or include new components. The operations performed by modules, programming modules, or the other components, according to various embodiments of the present disclosure, may be executed in serial, parallel, repetitive or heuristic fashion. Part of the operations can be executed in any other order, skipped, or executed with additional operations.

The various embodiments described in the present disclosure are merely provided to assist in a comprehensive understanding of the disclosure and the technology thereof and are not suggestive of limitation. Although various embodiments of the disclosure have been described in detail above, it should be understood that many variations and modifications of the basic inventive concept herein described, which may be apparent to those skilled in the art, will still fall within the spirit and scope of the various embodiments of the disclosure as defined in the appended claims.

Figure 4A:
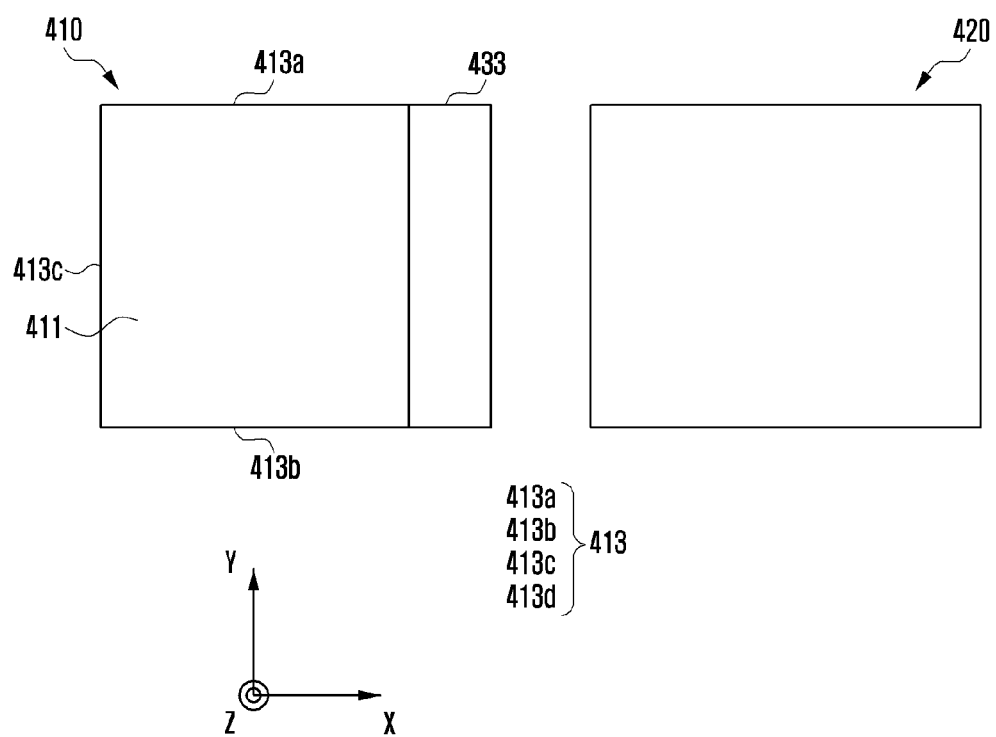
FIGS. 4A and 4B are diagrams illustrating a structure for shielding a magnetic force according to various embodiments of the present disclosure.
Figure 4B:
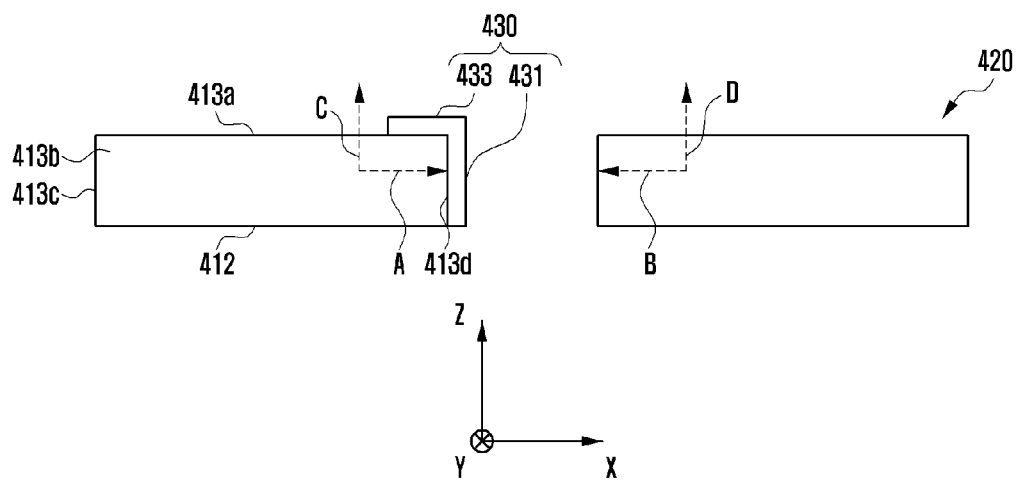

FIGS. 4A and 4B are diagrams illustrating a structure for shielding a magnetic force according to various embodiments of the present disclosure. FIG. 4A is a diagram illustrating a front surface of two electronic components that may be mounted in an electronic device (e.g., the electronic device 201) and FIG. 4B is a diagram illustrating one side surface of two electronic components.

Referring to FIGS. 4A and 4B, a first electronic component 410 has a magnet and may be any one of, for example, the magnetic sensor 240D, acceleration sensor 240E, speaker 282, receiver 284, and camera module 291. A second electronic component 420 also has a magnet and may be another one of the constituent elements.

When the first and second electronic components 410 and 420 are adjacently mounted in the electronic device, magnets of the first and second electronic components 410 and 420 may have an influence on each other; thus, an error may occur in operation of the first and second electronic components 410 and 420. In order to prevent such an error, for example, as shown in FIG. 4B, a ¬-shaped shield structure 430 made of a conductive material (e.g., SUS, ferrite) may be positioned between the first and second electronic components 410 and 420.

Magnetic fluxes emitted from each magnet of the first and second electronic components 410 and 420 may have a different intensity. For example, a magnet provided in the first electronic component 410 may have magnetism stronger than that provided in the second electronic component 420. Accordingly, a magnetic flux emitted from the second electronic component 420 may have no large influence on operation of the first electronic component 410, but a magnetic flux emitted from the first electronic component 410 may cause a relatively serious error in operation of the second electronic component 420. Therefore, the shield structure 430 may be positioned adjacent to the electronic component that emits a relatively strong magnetic flux among the first and second electronic components 410 and 420.

According to an embodiment, the shield structure 430 may be positioned adjacent to the first electronic component 410 rather than the second electronic component 420. For example, the first electronic component 410 may include a front structure 411 constituting a front surface of the first electronic component 410, a rear structure 412 constituting a rear surface thereof, and a side frame 413 that encloses a space between the front structure 411 and the rear structure 412. Here, the front surface may be referred to as the rear surface and vice versa.

The side frame 413 may include a member 413a constituting an upper side surface of the first electronic component 410, a member 413b constituting a low side surface thereof, a member 413c constituting a left side surface thereof, and a right side member 413d constituting a right side surface thereof. In such a configuration, the second electronic component 420 may be positioned beside the right side member 413d. Therefore, the shield structure 430 may include a first shield structure 431 that covers the right side member 413d and a second shield structure 433 extended from the first shield structure 431 to cover a portion of the front structure 411.

As shown in FIG. 4B, the first shield structure 431 may be attached to the right side member 413d. Accordingly, a magnetic flux A emitted in an X-axis direction from a magnet received in the first electronic component 410 may be absorbed in the first shield structure 431 so as not to arrive at the second electronic component 420. Further, a magnetic flux B emitted in an X-axis direction from a magnet received in the second electronic component 420 may be absorbed in the first shield structure 431 so as not to arrive at the first electronic component 410. According to an embodiment, the first shield structure 431 may be coated in a pigment form or may be bonded in a tape form to the inside or the outside of the right side member 413d.

As shown in FIG. 4B, the second shield structure 433 may be attached to the front structure 411 to be adjacent to the right side surface of the first electronic component 410. Accordingly, a magnetic flux C emitted in a Z-axis direction from the magnet received in the first electronic component 410 may be absorbed in the second shield structure 433 so as not to arrive at the second electronic component 420. Further, a magnetic flux D emitted in a Z-axis direction from the magnet received in the second electronic component 420 may be absorbed in the second shield structure 433 so as not to arrive at the first electronic component 410.

When the first and second electronic components 410 and 420 are adjacently positioned, magnets have an influence on each other. For example, when the second electronic component 420 is separated from the first electronic component 410 by any radius (e.g., 20 mm) or more, a desired shielding effect may be expected even only with the side shield structure (the first shield structure 431). However, when the second electronic component 420 exists within the radius from the first electronic component 410, as described above, magnetic fluxes C and D of a Z-axis direction may cause an error in operation of the first and second electronic components 410 and 420. Therefore, as described above, by designing the shield structure in a "¬" shape, even if the first and second electronic components 410 and 420 are adjacently positioned within the radius, a desired shielding effect can be expected.

FIGS. 5A, 5B, 5C, and 5D are diagrams illustrating various configurations of a shield structure in an electronic device according to various embodiments of the present disclosure.

Figure 5A:
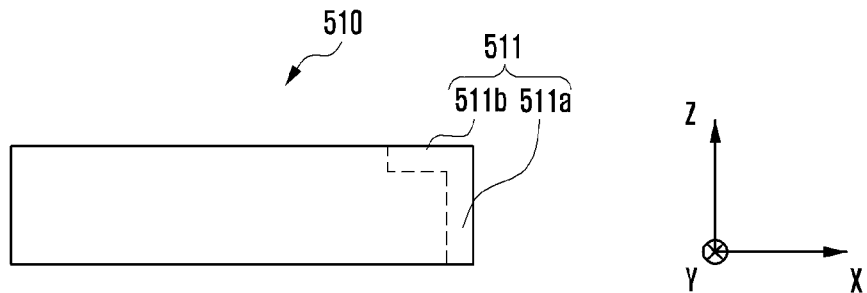
FIGS. 5A, 5B, 5C, and 5D are diagrams illustrating various configurations of a shield structure in an electronic device according to various embodiments of the present disclosure.

Referring to FIGS. 5A to 5D, in a structure constituting an external shape of an electronic component 510, a portion thereof may be made of a material (e.g., a ferromagnetic substance made of an element or an alloy such as metal or Fe, Co, and Ni) for a shield. For example, as shown in FIG. 5A, a shield structure 511 may include a first shield structure 511a constituting a right side surface of the electronic component 510 and a second shield structure 511b constituting a portion of a front surface of the electronic component 510.

Figure 5B:
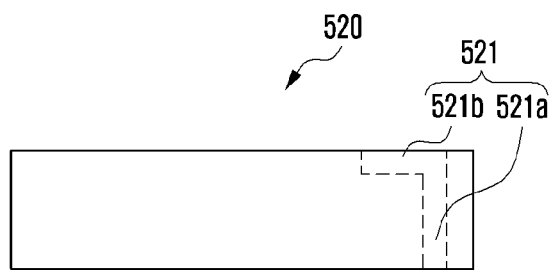

As another example, as shown in FIG. 5B, a shield structure 521 may include a first shield structure 521a received at an inner space of an electronic component 520 and a second shield structure 521b constituting a portion of a front surface of the electronic component 520.

Figure 5C:
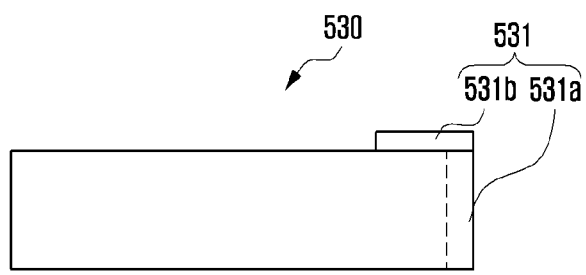

As another example, as shown in FIG. 5C, a shield structure 531 may include a first shield structure 531a constituting a right side surface of an electronic component 530 and a second shield structure 531b attached to a portion of a front surface of the electronic component 530.

Figure 5D:
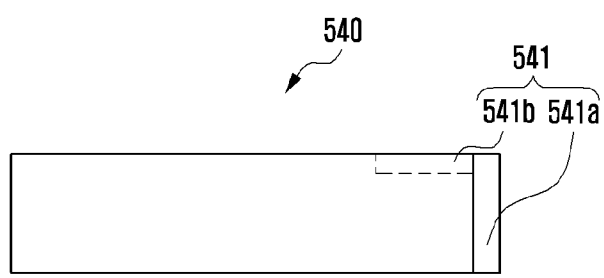

As another example, as shown in FIG. 5D, a shield structure 541 may include a first shield structure 541a attached to a right side surface of an electronic component 540 and a second shield structure 541b constituting a portion of a front surface of the electronic component 540.

Figure 6A:
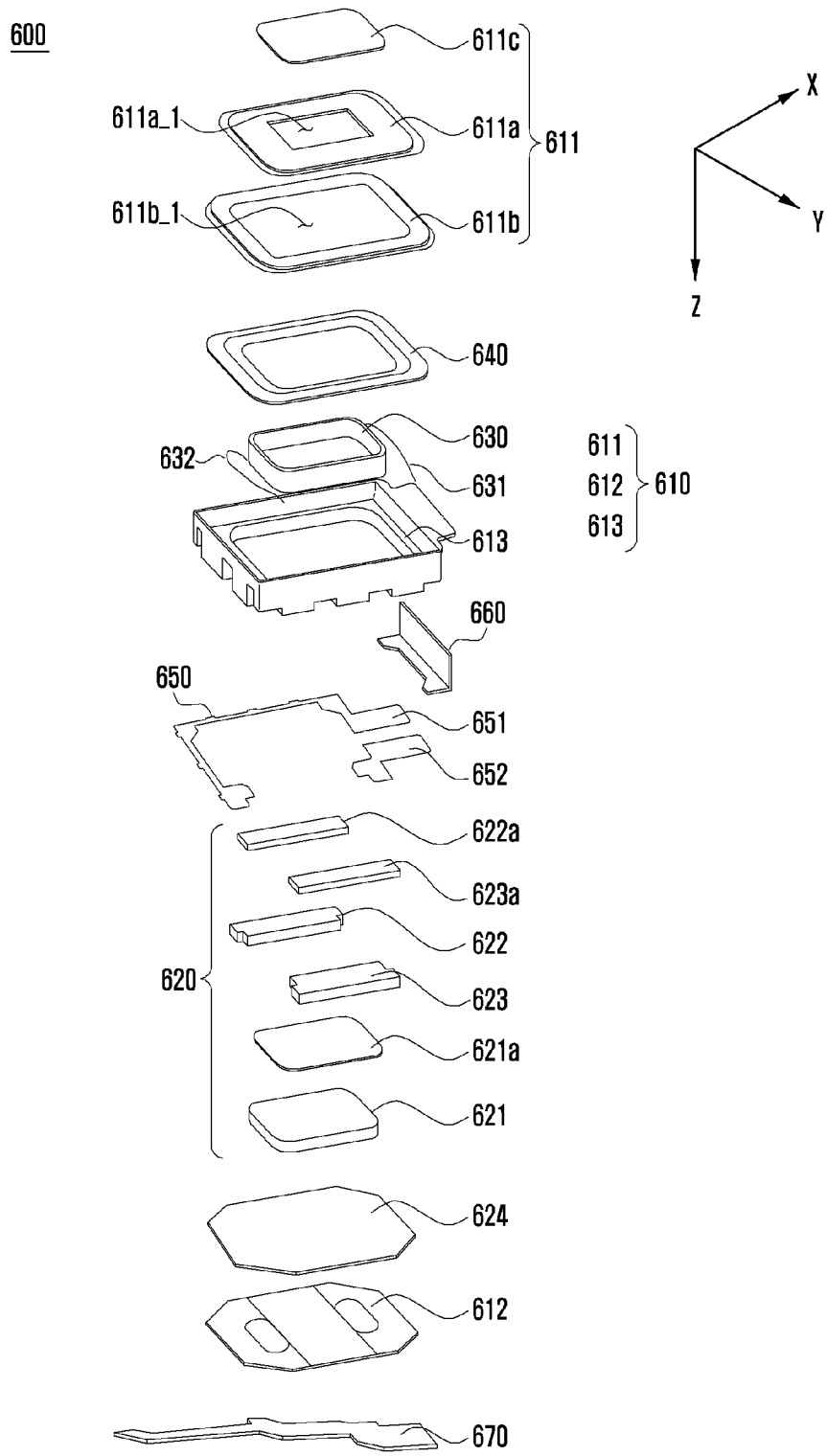
FIGS. 6A, 6B, 6C, 6D, and 6E illustrate a receiver having a shield structure according to various embodiments of the present disclosure.
Figure 6B:
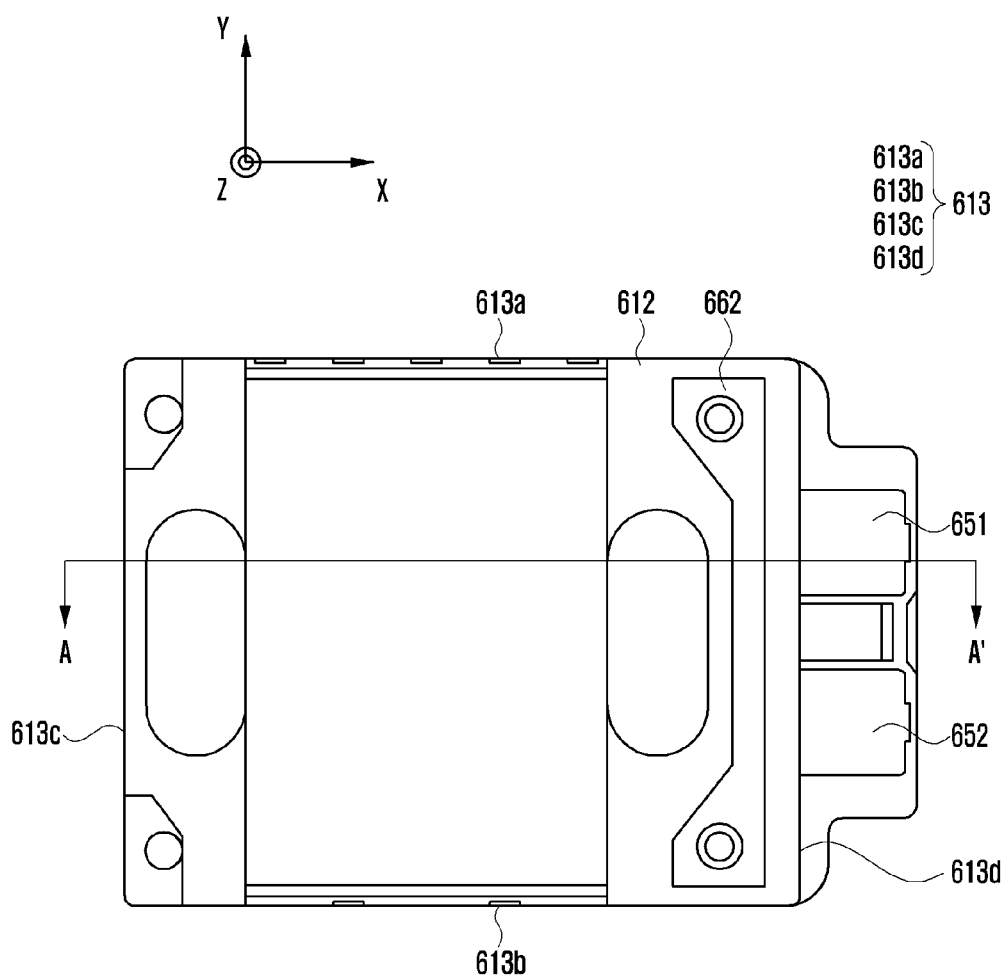
Figure 6C:
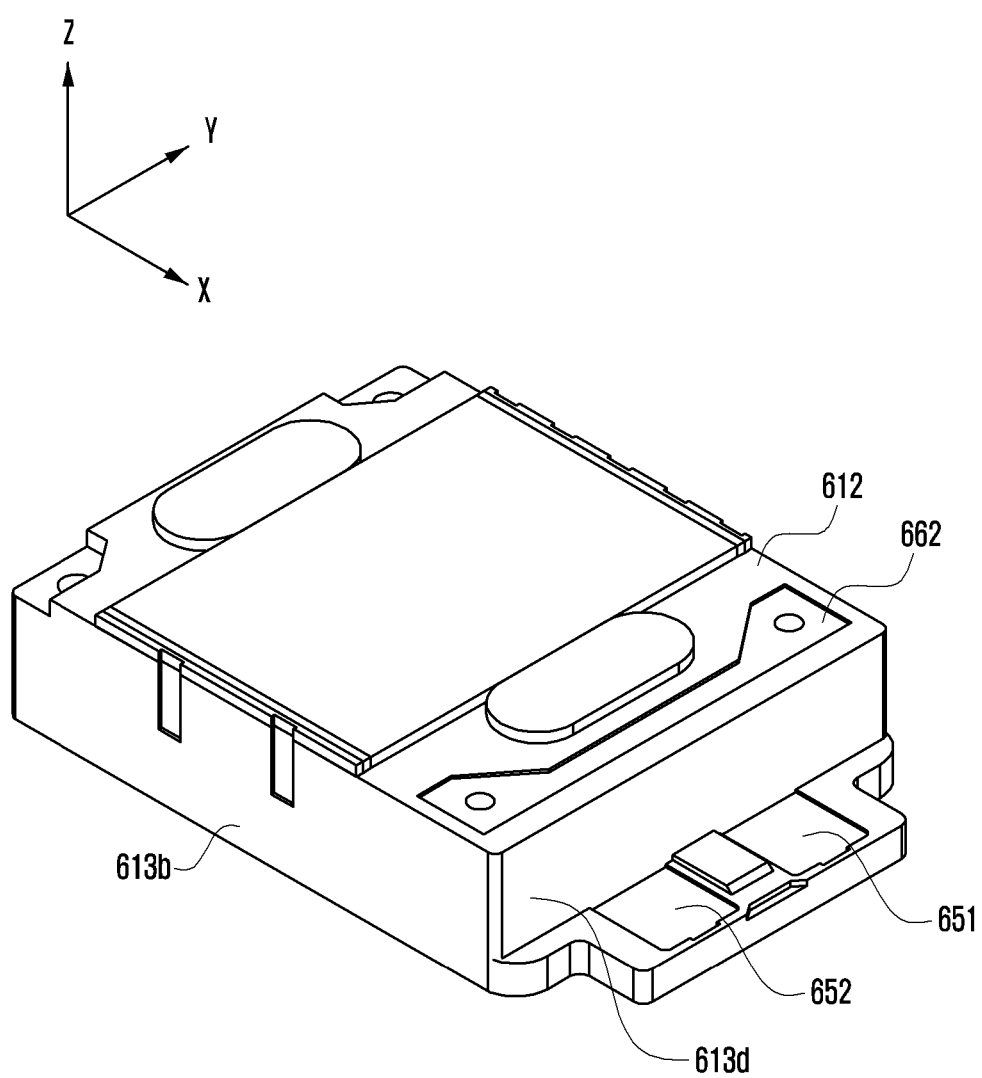
Figure 6D:
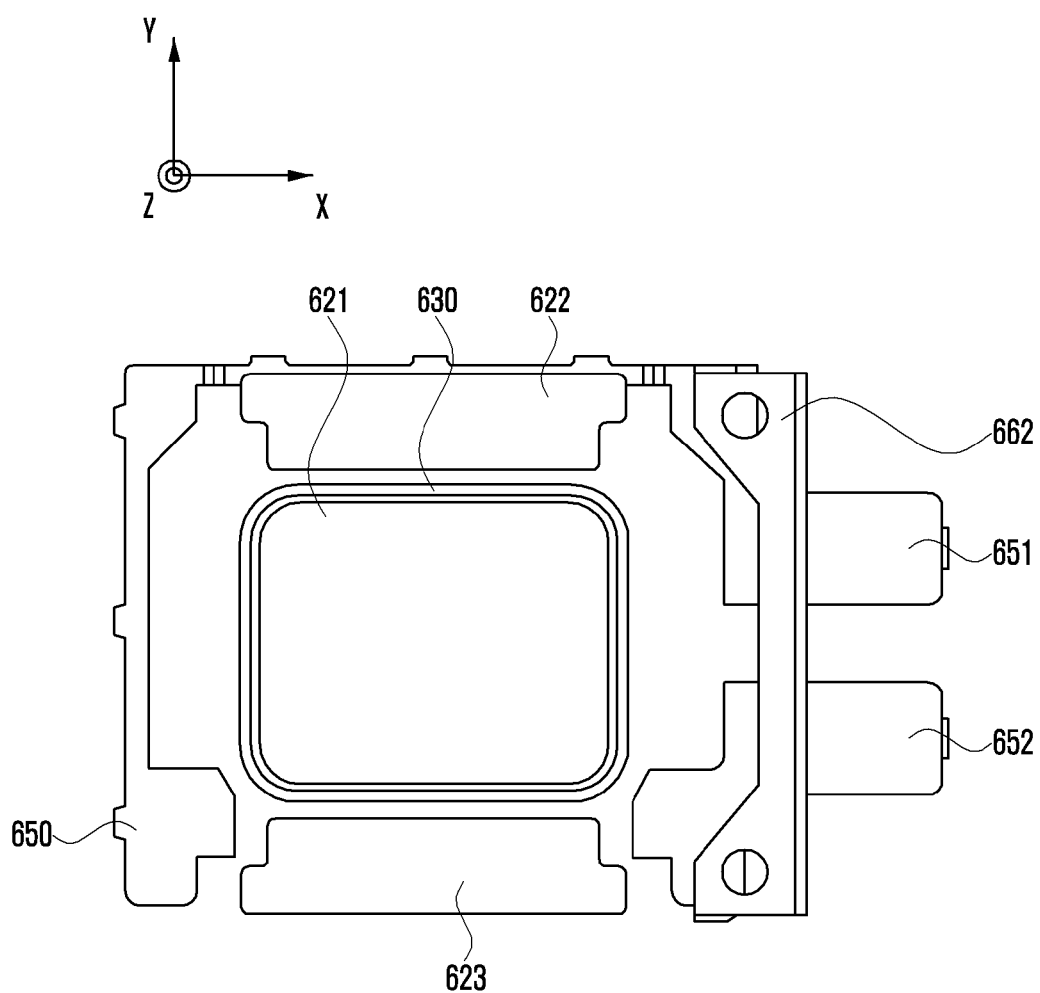
Figure 6E:
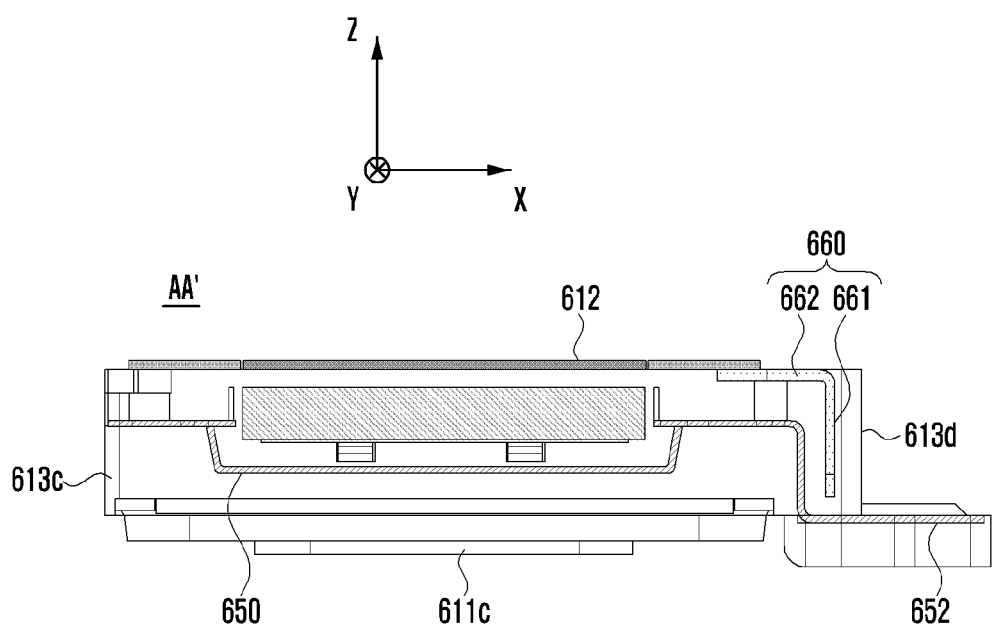

FIGS. 6A, 6B, 6C, 6D, and 6E illustrate a receiver having a shield structure according to various embodiments of the present disclosure. Specifically, FIG. 6A is an exploded perspective view of a receiver whose front surface faces upward, FIG. 6B illustrates a rear surface of a receiver, FIG. 6C is a perspective view of a receiver, FIG. 6D illustrates a rear surface of a receiver in a state in which an outer structure thereof is removed, and FIG. 6E is a cross-sectional view of a receiver taken along line AA' of FIG. 6B.

Referring to FIGS. 6A to 6E, a receiver 600 may include an outer structure 610 constituting the outside thereof, yoke assembly 620, coil 630, vibration plate 640, terminal pad 650, and shield structure 660.

The outer structure 610 may include a front structure 611 constituting at least a portion of a front surface of the receiver 600, a rear structure 612 constituting at least a portion of a rear surface of the receiver 600, and a side frame 613 that encloses a space between the front structure 611 and the rear structure 612. At an inner space formed by the outer structure 610, the yoke assembly 620, the coil 630, the vibration plate 640, the terminal pad 650, and the shield structure 660 may be received. With reference to FIG. 6B, the side frame 613 may include an upper side member 613a constituting an upper side surface of the receiver 600, a lower side member 613b constituting a lower side surface thereof, a left side member 613c constituting a left side surface thereof, and a right side member 613d constituting a right side surface thereof.

The front structure 611 protects the vibration plate 640 and may include a first protection member 611a and a second protection member 611b. The second protection member 611b may be attached to a low surface of the first protection member 611a, and the vibration plate 640 may be attached to a low surface of the second protection member 611b. In the first protection member 611a and the second protection member 611b, a first opening 611a_1 and a second opening 611b_1, respectively may be formed, and the vibration plate 640 may be exposed to the outside through the first and second openings 611a_1 and 611b_1. Further, the front structure 611 may further include a screen 611c. The screen 611c blocks or fills the first opening 611a_1 in order to prevent a foreign substance from entering into the receiver 600 through the first opening 611a_1 and may be formed with a sponge or a net mesh.

The coil 630 is attached to a low surface of the vibration plate 640, and electrodes 631 and 632 of the coil 630 may be connected to the terminal pad 650.

When viewing the receiver 600 above a front surface, the vibration plate 640 is positioned on the coil 630 and the yoke assembly 620 and is attached to the coil 630 to vibrate, as the coil 630 vertically moves in a Z-axis direction.

The terminal pad 650 may be mostly positioned at an inner space of the receiver 600 to be electrically connected to electrodes 631 and 632 of the coil 630. A portion of the terminal pad 650, for example, the first electrode 651 and the second electrode 652 may be exposed to the outside of the receiver 600. The first electrode 651 and the second electrode 652 are electrically connected to an audio module (e.g., the audio module 280) through a flexible printed circuit board (FPCB) 670 to receive a current for outputting audio.

The yoke assembly 620 may include a first magnet 621, a second magnet 622, a third magnet 623, and a yoke 624 for fixing magnets 621-623 as a means for increasing efficiency of a vertical movement of the coil 630.

The first magnet 621 may be positioned within the coil 630, and the second magnet 622 and the third magnet 623 may be positioned outside the coil 630 to be vertically symmetric about the first magnet 621. The second magnet 622 and the third magnet 623 may have the same polarity in the same direction and may have the polarity different from that of the first magnet 621. For example, when viewing the receiver 600 above a rear surface, if the first magnet 621 is an N pole, the second magnet 622 and the third magnet 623 may be an S pole and vice versa.

The yoke assembly 620 blocks a magnetic flux emitted from the magnet from being leaked to a front surface of the receiver 600 and may further include a plurality of plates 621a, 622a, and 623a of a conductive material. When viewing the receiver 600 above a front surface, the plate 621a of a conductive material may be attached on the first magnet 621. Further, the plates 622a and 623a of a conductive material may be attached even on the second magnet 622 and the third magnet 623.

The shield structure 660 may be configured to block a magnetic flux emitted from the magnets 621-623 from having an influence on a magnet of another electronic component disposed adjacent to a right side surface of the receiver 600 and to block a magnetic flux emitted from a magnet of another electronic component from having an influence on the magnets 621-623. For example, the shield structure 660 may include a side shield structure 661 and a rear shield structure 662.

The side shield structure 661 may be positioned within the outer structure 610 and adjacent to the right side member 613d. The rear shield structure 662 may be extended from the side shield structure 661 to be bent toward the receiver 600. Further, at least a portion of the rear shield structure 662 may be exposed to the outside through a rear surface of the receiver 600.

When a current is supplied to the coil 630 through the terminal pad 650, a magnetic field is inducted in the coil 630, and the magnetic field inducted in this way mutually operates with the magnets 621-623 to vertically move the coil 630 in a Z-axis direction. As the vibration plate 640 coupled to the coil 630 vibrates by a vertical movement of the coil 630, audio may occur in the receiver 600. However, when viewing the receiver 600 above a rear surface, even if the rear shield structure 662 covers an entire rear surface or a portion of the rear surface, when the rear shield structure 662 is overlapped with the coil 630, a phenomenon may occur in which a magnetic flux induced from the coil 630 to be emitted in a Z-axis direction is absorbed in the rear shield structure 662, and such a phenomenon may cause an error in a vertical movement of the coil 630. For example, the coil 630 may obliquely move toward the rear shield structure 662 and as a result undesired audio may be output. Therefore, as shown in FIG. 6D, when viewing the receiver 600 above a rear surface, the rear shield structure 662 may be disposed not to overlap with the coil 630.

When viewing the receiver 600 above a rear surface, if the rear shield structure 662 is overlapped with the second magnet 622 and the third magnet 623 disposed at an outer edge of the coil 630, a magnetic flux emitted in a Z-axis direction from the second magnet 622 and a magnetic flux emitted in a Z-axis direction from the third magnet 623 may be absorbed in the rear shield structure 662. That is, the rear shield structure 662 may be a passage that connects the second magnet 622 and the third magnet 623. The second magnet 622 and the third magnet 623 may operate like one magnet, and this may cause imbalance of a magnetic force. When the magnets 621-623 mutually operate with the coil 630, such imbalance of a magnetic force may cause an error. For example, the coil 630 may obliquely move toward the rear shield structure 662 and as a result undesired audio may be output. Therefore, when viewing the receiver 600 above a rear surface, the rear shield structure 662 may not be overlapped with any one of the second magnet 622 and the third magnet 623. According to an embodiment, the rear shield structure 662 may be overlapped with any one of the second magnet 622 and the third magnet 623, but it may be disposed not to be overlapped with magnets 622-623.

Figure 7A:
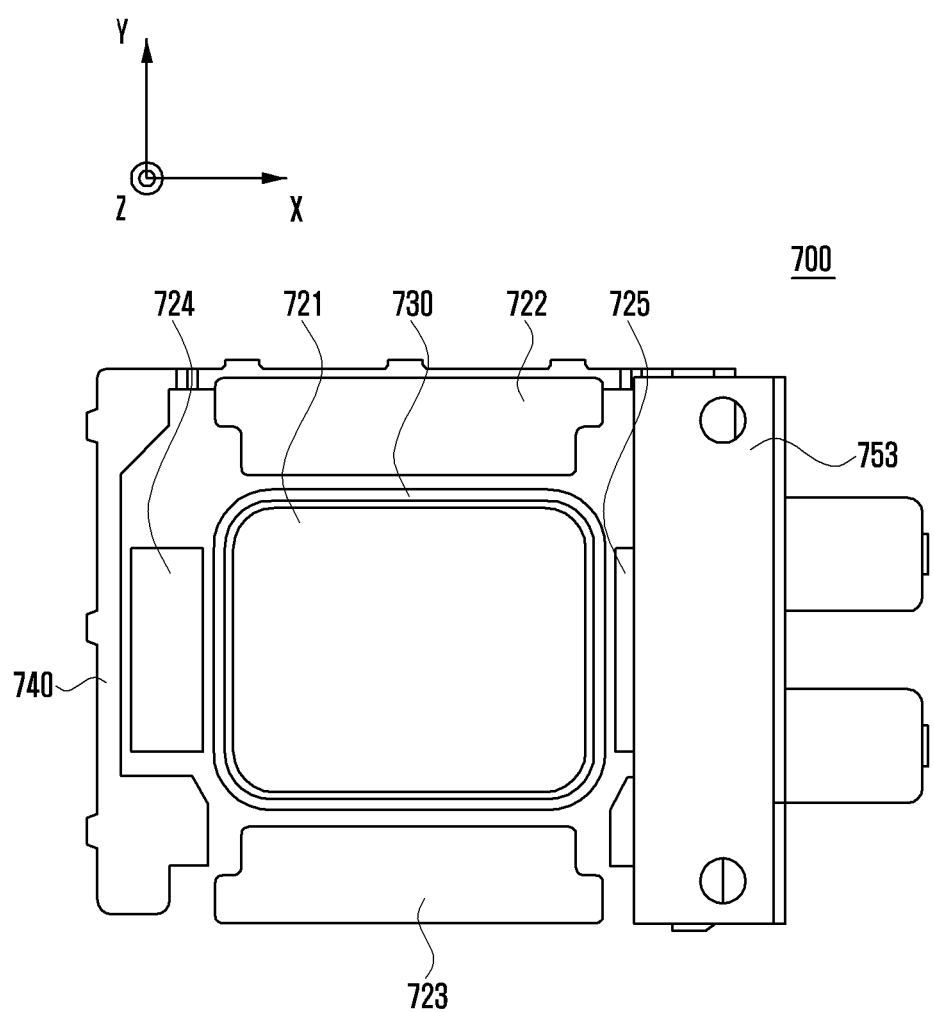
FIGS. 7A and 7B illustrate a receiver having a shield structure according to various embodiments of the present disclosure.
Figure 7B:
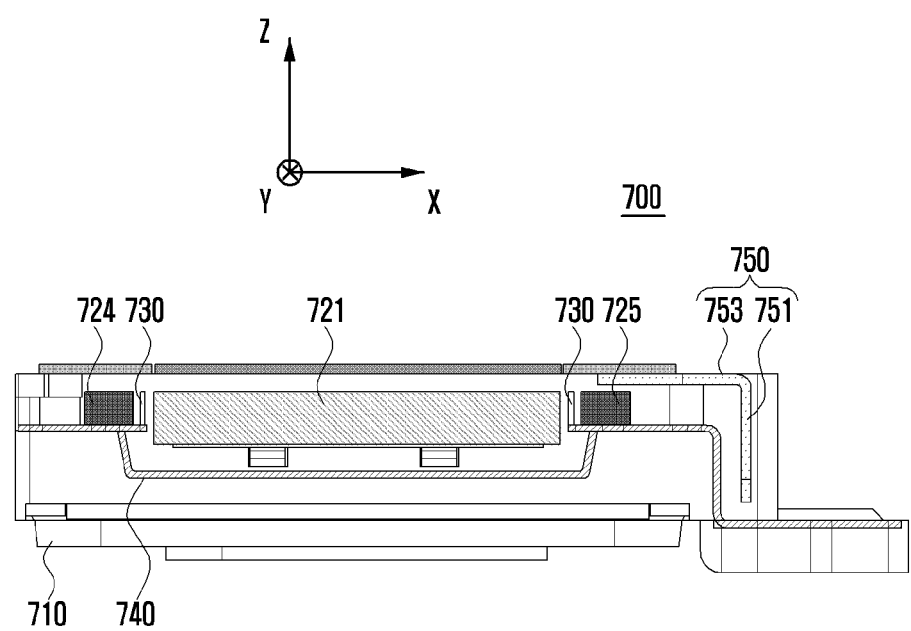

FIGS. 7A and 7B illustrate a receiver having a shield structure according to various embodiments of the present disclosure. FIG. 7A illustrates a rear surface of a receiver in a state in which an outer structure is removed, and FIG. 7B is a cross-sectional view of a receiver.

Referring to FIGS. 7A and 7B, a receiver 700 may include an outer structure 710, first magnet 721, second magnet 722, third magnet 723, fourth magnet 724, fifth magnet 725, coil 730, terminal pad 740, and shield structure 750. As shown in FIG. 7, it may be understood that the receiver 700 of FIG. 7 has the same configuration as that of the receiver 600 of FIG. 6 and further includes a fourth magnet 724 and a fifth magnet 725 positioned outside the coil 730 to be laterally symmetrical about the first magnet 721. The second magnet 722 and the third magnet 723 may have the same polarity in the same direction. The fourth magnet 724 and the fifth magnet 725 may also have the same polarity in the same direction. The first magnet 721 may have the polarity different from other magnets in the same direction.

The shield structure 750 includes a side shield structure 751 and a rear shield structure 753, and the rear shield structure 753 may be disposed not to overlap with the coil 730, when viewing the receiver 700 above a rear surface. Further, when viewing the receiver 700 above a rear surface, the rear shield structure 753 may be disposed not to overlap with at least two magnets. When the rear shield structure 753 is overlapped with the fifth magnet 725 and the second magnet 722 or the third magnet 723, the second magnet 722 (or the third magnet 723) and the fifth magnet 725 may operate like one magnet to cause imbalance of a magnetic field. Imbalance of such a magnetic field may cause an undesired audio output. When the rear shield structure 753 is overlapped with the first magnet 721 within the coil 730 over the fifth magnet 725, the first magnet 721 and the fifth magnet 725 operate like one magnet; thus, even if a current flows to the coil 730, a phenomenon may occur in which the coil 730 does not move. Therefore, when viewing a rear surface above the receiver 700, even if the rear shield structure 753 is overlapped with the fifth magnet 725 of the magnets 721-725, the rear shield structure 753 may be disposed not be overlapped with other magnets.

Figure 8:
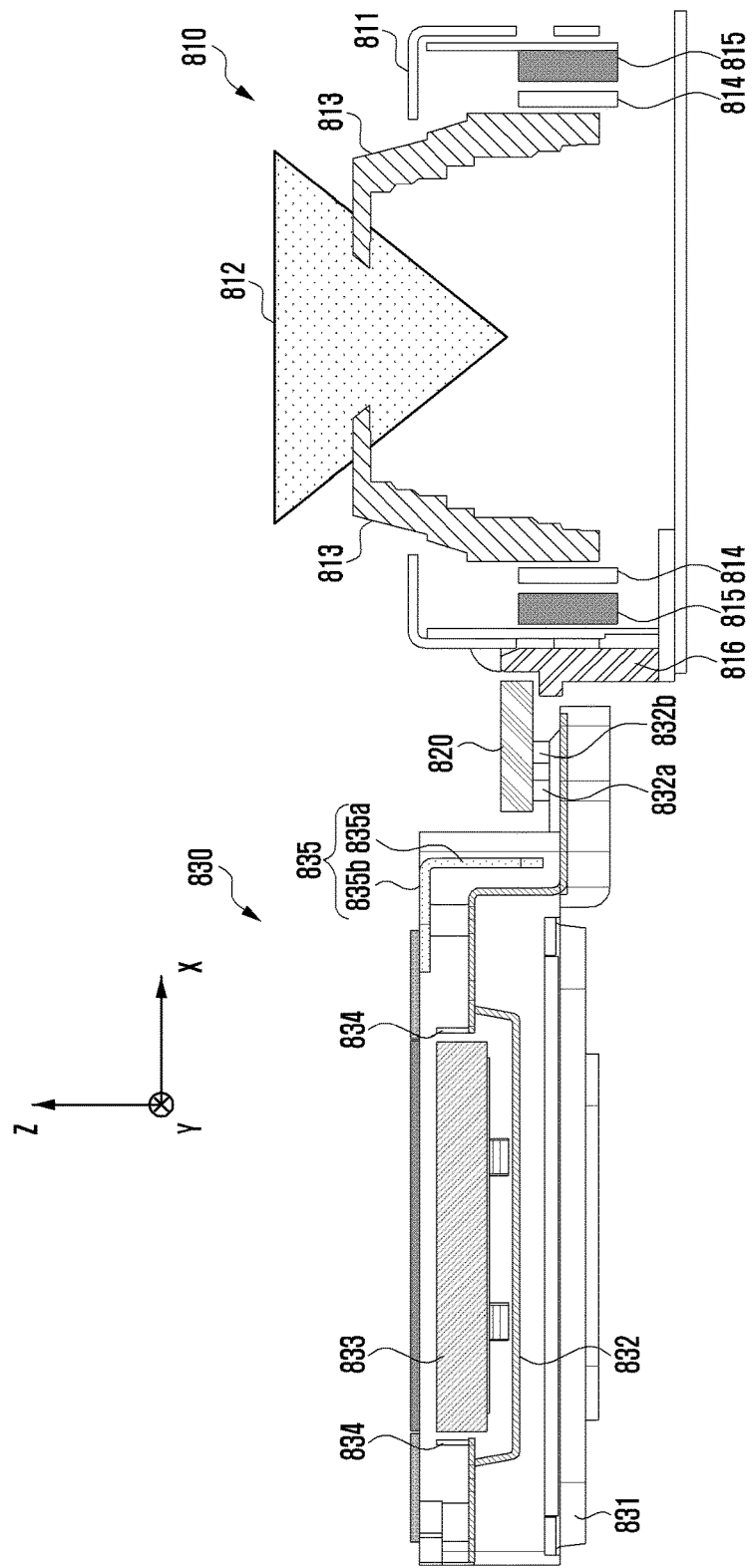
FIG. 8 is a cross-sectional view illustrating an adjacently positioned receiver and camera in an electronic device according to various embodiments of the present disclosure.

FIG. 8 is a cross-sectional view illustrating an adjacently positioned receiver and camera in an electronic device according to various embodiments of the present disclosure.

Referring to FIG. 8, a camera 810 may include an outer structure 811, lens 812, support structure 813, coil 814, magnet 815, and fastening portion 816. The lens 812 may be positioned at an inner space of the camera 810 and be exposed to the outside through one surface (e.g., a rear surface or a front surface) of the electronic device. The coil 814 is wound in the support structure 813 configured to support the lens 812 and may move the support structure 813 in any one direction (e.g., an X-axis direction, a Y-axis direction, or a Z-axis direction) by operating with the magnet 815 positioned outside the coil 814 by reacting to a current supplied to the coil 814. That is, the coil 814 and the magnet 815 may operate as an actuator for, for example, Auto Focus (AF) (movement in a Z-axis direction) or for optical image stabilization (OIS) (movement in an X-axis or a Y-axis direction). The fastening portion 816 is coupled to the outer structure 811 and fixes the camera 810 to a printed circuit board (PCB) 820. The camera 810 may include a plurality of camera modules, and a position between the receiver and the camera is exemplified for convenience of description and the present disclosure is not limited thereto.

A receiver 830 may be disposed at the left side of the camera 810 with the PCB 820 interposed therebetween and may output audio through a front surface of the electronic device. The receiver 830 may include an outer structure 831, terminal pad 832, first magnet 833, second magnet (not shown), third magnet (not shown), coil 834, and shield structure 835.

The terminal pad 832 is mostly received at an inner space of the outer structure 831, and electrodes 832a and 832b, which are portions thereof, may be exposed to the outside to be electrically connected to the PCB 820. Although not shown in the PCB 820, an audio module (e.g., the audio module 280) may be mounted thereto and may be electrically connected to the first electrode 832a and the second electrode 832b to output an audio signal to the terminal pad 832.

The coil 834 may be positioned within the receiver 830 and react to an audio signal received through the terminal pad 832 to mutually operate with the first magnet 833 positioned within the coil 834 and the second magnet and the third magnet positioned vertically symmetrically to the outside of the coil 834, thereby vertically moving in any one direction (e.g., a Z-axis direction). Accordingly, as a vibration plate (not shown) physically connected to the coil 834 vibrates, audio corresponding to an audio signal may be output from the receiver 830.

The shield structure 835 is installed at the right side of the outer structure 831 adjacent toward the camera 810 and may include a side shield structure 835a received at an inner space of the outer structure 831 and a rear shield structure 835b extended from the side shield structure 835a to be bent to the inside of the receiver 830. When viewing the receiver 830 above a rear surface, the shield structure 835 may be overlapped with one of magnets positioned outside the coil 834 and may be disposed not to be overlapped with at least two magnets and not to be overlapped with the coil 834, and it may block a magnetic field from having an influence on the magnet 815 of the camera 810 without causing imbalance of a magnetic field generated in the receiver 830. Further, the shield structure 835 may block the magnet 815 of the camera 810 from having an influence on magnets of the receiver 830.

In the foregoing description, it may be understood that the receiver 830 of FIG. 8 has the same configuration and structure as those of the receiver 600 of FIG. 6. Alternatively, it may be understood that the receiver 830 of FIG. 8 further includes a fourth magnet and a fifth magnet to have the same configuration and structure as those of the receiver 700 of FIG. 7.

Figure 9A:
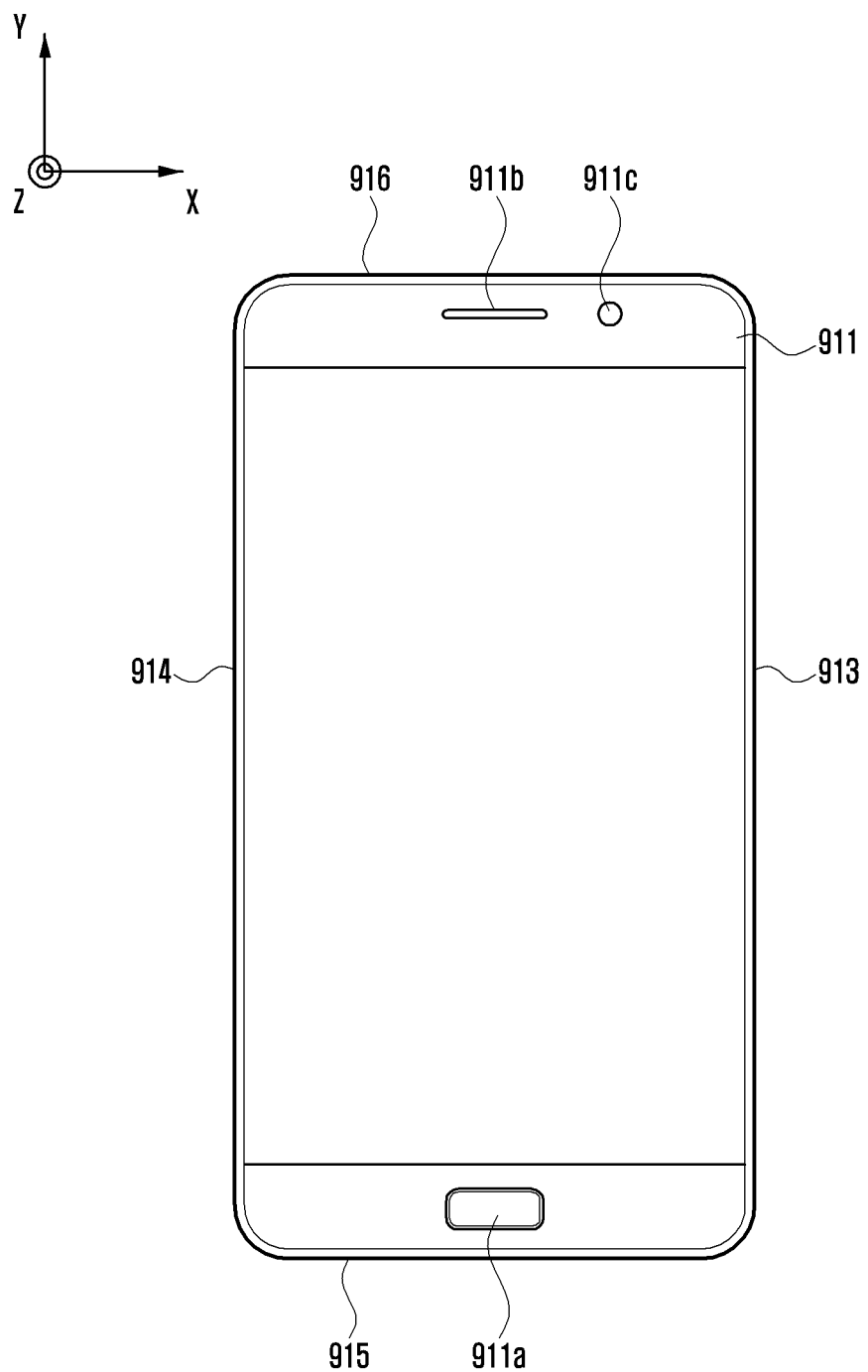
FIGS. 9A, 9B, and 9C illustrate an electronic device according to various embodiments of the present disclosure.
Figure 9B:
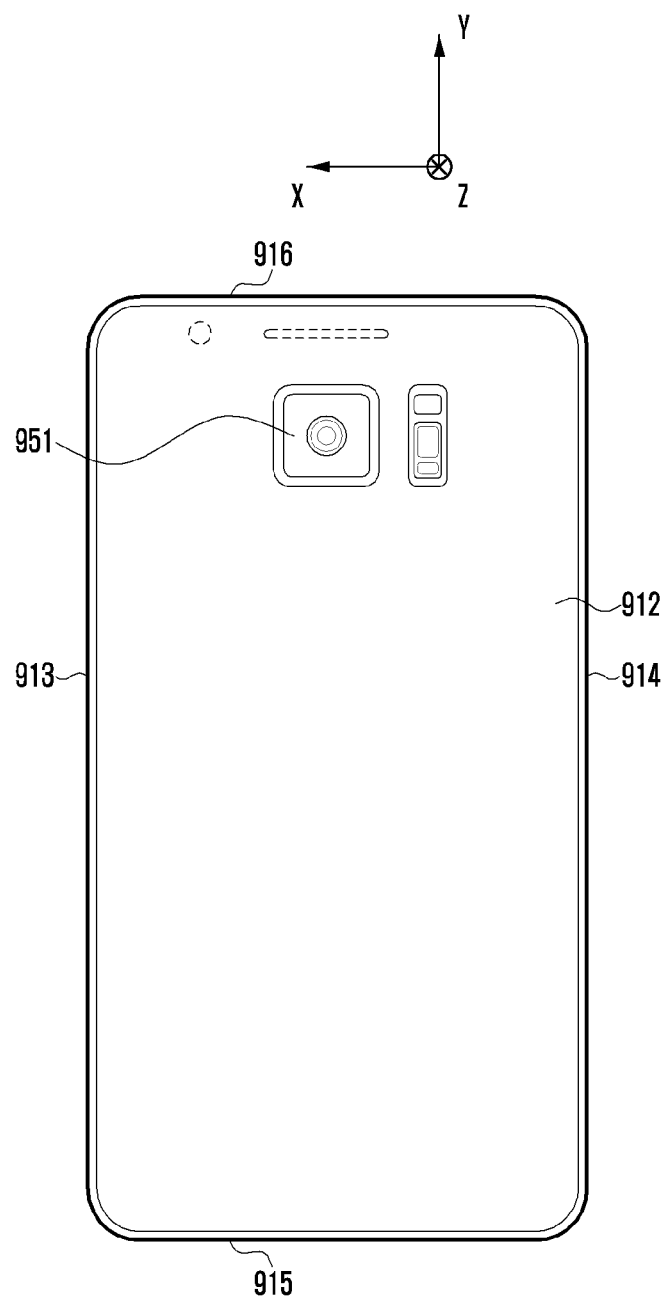
Figure 9C:
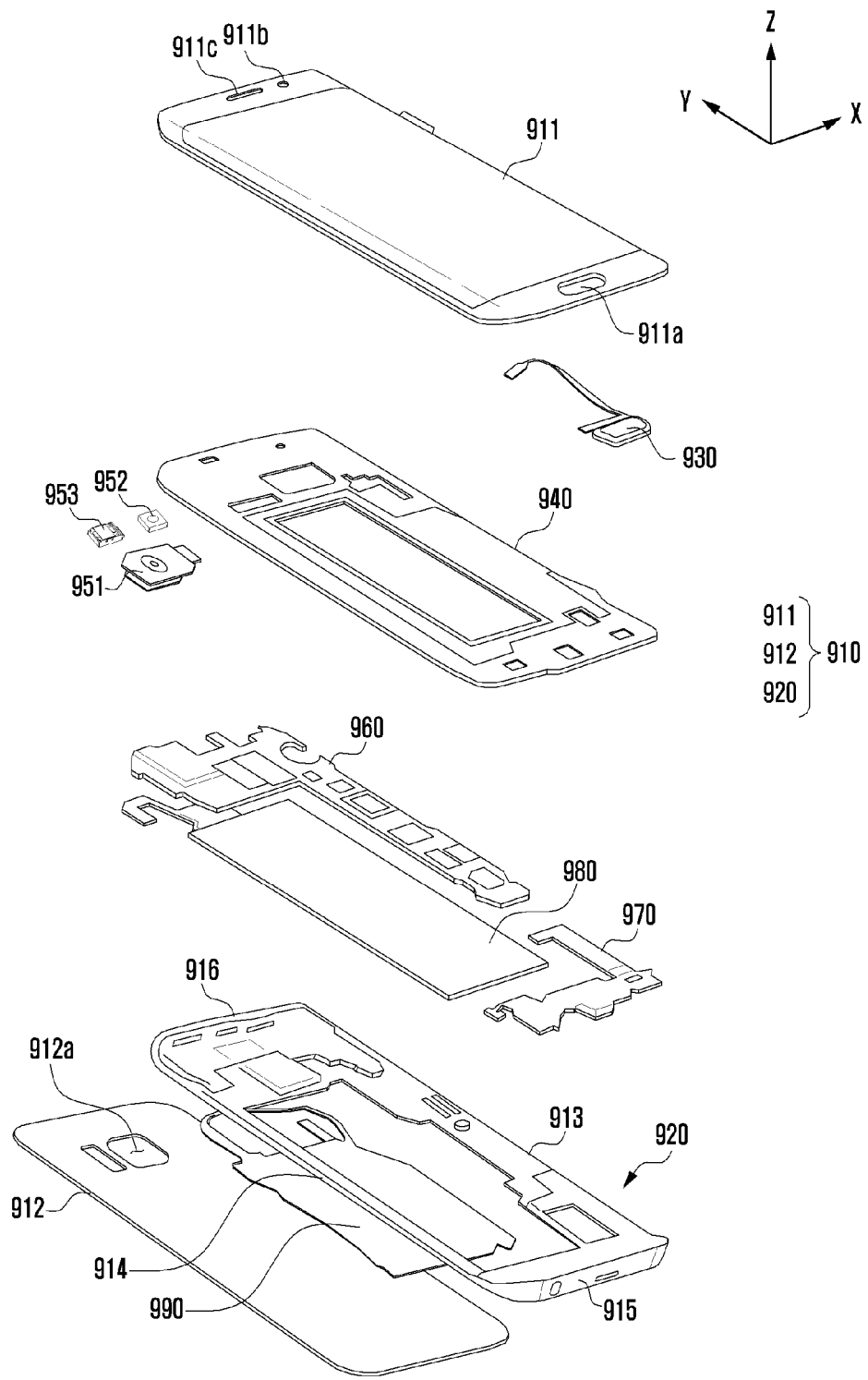

FIGS. 9A, 9B, and 9C illustrate an electronic device according to various embodiments of the present disclosure.

FIG. 9A illustrates a front surface of the electronic device, FIG. 9B illustrates a rear surface of the electronic device, and FIG. 9C is an exploded perspective view of the electronic device.

Referring to FIGS. 9A, 9B and 9C, the electronic device (e.g., the electronic device 101) may include various electronic components and a housing 910 for protecting the various electronic components. The housing 910 may include a first surface 911 facing in a first direction, a second surface 912 facing in a second direction substantially opposite to the first direction, and a side member 920 that encloses at least a portion of a space between the first surface 911 and the second surface 912. For example, the first surface 911 may be a cover constituting a front surface of the electronic device, and a display may be exposed through at least a portion of the front surface. For example, the second surface 912 may be a cover constituting a rear surface of the electronic device. The side member 920 may include a right side cover 913 constituting a right side surface of the electronic device, a left side cover 914 constituting a left side surface of the electronic device, a lower side cover 915 constituting a low side surface of the electronic device, and an upper side cover 916 constituting an upper side surface of the electronic device.

Inside the housing 910, a fingerprint sensor 930, a support structure 940 configured to support the first surface 911, at least one rear camera 951, at least one front camera 952, a receiver 953, a first substrate 960, a second substrate 970, a battery 980, and an antenna 990 may be positioned. The fingerprint sensor 930, the at least one front camera 952, or the receiver 953 may be positioned within the display 160.

The fingerprint sensor 930 may be electrically connected to the first substrate 960 and/or the second substrate 970, and in at least a portion (e.g., the display 160 or the home key 911a) of the first surface 911, the fingerprint sensor 930 may recognize a contact of a fingerprint and generate fingerprint data to output the fingerprint data to a processor (e.g., AP) mounted in the first substrate 960.

The at least one rear camera 951 may be mounted in the first substrate 960 to be exposed through a hole 912a formed in the second surface 912.

The at least one front camera 952 may be mounted in the first substrate 960 to be exposed through a hole 911b formed in the first surface 911.

The receiver 953 may be mounted in the first substrate 960 to be exposed through a hole 911c formed in the first surface 911. With reference to FIG. 9C, the at least one rear camera 951 may be positioned under the receiver 953, and at the right side thereof, the at least one front camera 952 may be positioned. According to an embodiment, the receiver 953 may be positioned at the right side of the at least one rear camera 951 and the at least one front camera 952 may be positioned at the right side of the receiver 953, and the present disclosure is not limited thereto. As described with reference to FIG. 6, the receiver 953 may include three magnets, or as described with reference to FIG. 7, the receiver 953 may include five magnets. Further, the at least one rear camera 951 may include a magnet as an actuator for moving a lens. Because a magnet of the receiver 953 and a magnet of the at least one rear camera 951 may have an influence on each other, the receiver 953 may include the foregoing various shield structures.

The first substrate 960 may be positioned adjacent to the upper side cover 916 and be electrically connected to the upper side cover 916. The second substrate 970 may be positioned adjacent to the lower side cover 915 and be electrically connected to the lower side cover 915. The antenna 990 may include a plurality of coil antennas for payment and may be electrically connected to a communication module (e.g., the NFC module 228) mounted in a substrate (e.g., the first substrate 960 or the second substrate 970).

An electronic device according to various embodiments of the present disclosure includes a housing including a first surface facing in a first direction, a second surface facing in a second direction opposite to the first direction, and a side member that encloses at least a portion of a space between the first surface and the second surface; a first electronic component including magnets positioned inside the housing and disposed to emit a magnetic flux in the first direction or the second direction; a second electronic component including at least one magnet positioned inside the housing and disposed to emit a magnetic flux in the first direction or the second direction and disposed beside one side surface of the first electronic component in a substantially vertical direction to the first direction or the second direction; and a shield structure disposed between the first electronic component and the second electronic component, wherein the shield structure includes a first shield structure formed at the one side surface and a second shield structure formed in a substantially vertical direction to the one side surface and disposed not to overlap with at least two of magnets of the first electronic component, when viewed above the second surface.

The shield structure may absorb a magnetic flux emitted from magnets of the first electronic component to prevent any influence on at least one magnet of the second electronic component.

The shield structure may absorb a magnetic flux emitted from at least one magnet of the second electronic component to prevent any influence on at least a portion of magnets of the first electronic component.

The second shield structure may be extended from the first shield structure to be bent in a substantially vertical direction to the one side surface.

The first electronic component may include a receiver, and the second electronic component may include a camera.

A gap between the receiver and the camera may be within 20 mm.

The receiver may be exposed through the first surface, and the camera may be exposed through the second surface.

The receiver and the camera may be exposed through the first surface.

The first electronic component may further include a coil, and the second shield structure may be disposed not to overlap with the coil, when viewed above the second surface.

The first electronic component may include a first structure facing in the first direction, a second structure facing in the second direction, a side frame that encloses a space between the first structure and the second structure, and at least a portion of the shield structure may be received at a space between the first structure and the second structure.

The first electronic component may include a first structure facing in the first direction, a second structure facing in the second direction, a side frame that encloses a space between the first structure and the second structure, and at least a portion of the shield structure may configure a portion of the side frame.

The first electronic component may include a first structure facing in the first direction, a second structure facing in the second direction, and a side frame that encloses a space between the first structure and the second structure, wherein the first shield structure may be attached to the side frame and the second shield structure may be attached to a portion of the second structure.

The first electronic component may be a receiver, and the receiver may include a coil; a first magnet disposed inside the coil; a second magnet disposed outside the coil; and a third magnet disposed outside the coil to be symmetric to the second magnet, wherein the second shield structure may not overlap with the coil and be disposed not to overlap with at least two of the magnets, when viewed above the second surface.

The first electronic component may be a receiver, and the receiver may include a coil; a first magnet disposed inside the coil; a second magnet disposed outside the coil; and a third magnet disposed outside the coil to be symmetric to the second magnet, wherein the second shield structure may not overlap with the coil and be disposed not to overlap with at least two of the first magnet, the second magnet, and the third magnet, when viewed above the second surface.

An electronic device according to various embodiments of the present disclosure includes a housing including a first surface facing in a first direction, a second surface facing in a second direction opposite to the first direction, and a side member that encloses at least a portion of a space between the first surface and the second surface; a receiver positioned inside the housing; a display positioned inside the housing and exposed through at least a portion of the first surface; and a processor positioned inside the housing and electrically connected to the receiver and the display, wherein the receiver includes a coil, a first magnet disposed inside the coil and disposed to emit a magnetic flux in the first direction or the second direction, a second magnet disposed outside the coil, a third magnet disposed outside the coil to be symmetric to the second magnet, and a shield structure made of a conductive material, wherein the shield structure includes a first shield structure formed in the first direction or the second direction and a second shield structure extended from the first shield structure in a substantially vertical direction to the first direction or the second direction and disposed not to overlap with the coil and the magnets, when viewed above the second surface.

The second shield structure may be extended from the first shield structure to be bent in a substantially vertical direction to the one side surface.

The receiver may be exposed through the first surface.

An electronic device according to various embodiments of the present disclosure includes a receiver including an actuator and a plurality of magnets for driving the actuator and including a first surface facing in a first direction (X or Y-axis) and a second surface facing in a second direction (Z-axis) vertical to the first direction; and a shield structure including a first shield structure formed in at least a portion of the first surface of the receiver and a second shield structure extended from the first shield structure and formed in at least a portion of the second surface, wherein the shield structure includes a second shield structure overlapped with one magnet adjacent to the first surface among the plurality of magnets or disposed not to overlap with the plurality of magnets, when viewed above the second surface in the second direction.

The second shield structure may be extended from the first shield structure to be bent in a substantially vertical direction to the one side surface.

The receiver may be exposed through the first surface.

According to various embodiments of the present disclosure, even if electronic components each including a magnet are adjacently installed in an electronic device, the electronic device can be provided so as to operate without an error while shielding a magnetic force of another component.

While the present disclosure has been shown and described with reference to various embodiments thereof, it will be clearly understood by those skilled in the art that various changes in form and details may be made therein without departing from the spirit and scope of the present disclosure as defined by the appended claims and their equivalents.

What is claimed is:

1. An electronic device, comprising:
    a housing comprising:
        a first surface facing a first direction,
        a second surface facing a second direction opposite to the first direction, and
        a side member configured to enclose at least a portion of a space between the first surface and the second surface;
    a first electronic component positioned inside the housing, the first electronic component comprising magnets disposed to emit a magnetic flux in the first direction or the second direction;
    a second electronic component positioned inside the housing, the second electronic component comprising at least one magnet disposed to emit a magnetic flux in the first direction or the second direction and being disposed beside one side surface of the first electronic component in a substantially vertical direction to the first direction or the second direction; and
    a shield structure disposed between the first electronic component and the second electronic component,
    wherein the shield structure comprises:
        a first shield structure formed at the one side surface, and
        a second shield structure formed in a substantially vertical direction to the one side surface and disposed not to overlap with at least two of magnets of the first electronic component, when viewed from above the second surface.

2. The electronic device of claim 1, wherein the shield structure is configured to absorb the magnetic flux emitted from the magnets of the first electronic component to prevent any influence on the at least one magnet of the second electronic component.

3. The electronic device of claim 1, wherein the shield structure is configured to absorb the magnetic flux emitted from the at least one magnet of the second electronic component to prevent any influence on at least a portion of the magnets of the first electronic component.

4. The electronic device of claim 1, wherein the second shield structure is extended from the first shield structure to be bent in the substantially vertical direction to the one side surface.

5. The electronic device of claim 1,
    wherein the first electronic component comprises a receiver, and
    wherein the second electronic component comprises a camera.

6. The electronic device of claim 5, further comprising:
    a gap positioned between the receiver and the camera,
    wherein the gap is within 20 mm.

7. The electronic device of claim 5,
    wherein the receiver is exposed through the first surface, and
    wherein the camera is exposed through the second surface.

8. The electronic device of claim 5, wherein the receiver and the camera are exposed through the first surface.

9. The electronic device of claim 1,
wherein the first electronic component further comprises a coil, and
wherein the second shield structure is disposed not to overlap with the coil, when viewed above the second surface.

10. The electronic device of claim 1,
wherein the first electronic component further comprises:
a first structure facing the first direction;
a second structure facing the second direction; and
a side frame configured to enclose a space between the first structure and the second structure, and
wherein at least a portion of the shield structure is received at a space between the first structure and the second structure.

11. The electronic device of claim 1,
wherein the first electronic component further comprises:
a first structure facing the first direction;
a second structure facing the second direction; and
a side frame configured to enclose a space between the first structure and the second structure, and
wherein at least a portion of the shield structure configures a portion of the side frame.

12. The electronic device of claim 1,
wherein the first electronic component further comprises:
a first structure facing the first direction;
a second structure facing the second direction; and
a side frame configured to enclose a space between the first structure and the second structure,
wherein the first shield structure is attached to the side frame, and
wherein the second shield structure is attached to a portion of the second structure.

13. The electronic device of claim 1,
wherein the first electronic component comprises a receiver,
wherein the receiver comprises:
a coil;
a first magnet disposed inside the coil;
a second magnet disposed outside the coil; and
a third magnet disposed outside of the coil to be symmetric to the second magnet, and
wherein the second shield structure does not overlap with the coil and is disposed not to overlap with at least two of the magnets, when viewed above the second surface.

14. The electronic device of claim 1,
wherein the first electronic component further comprises a receiver,
wherein the receiver comprises:
a coil;
a first magnet disposed inside the coil;
a second magnet disposed outside the coil; and
a third magnet disposed outside the coil to be symmetric to the second magnet, and
wherein the second shield structure does not overlap with the coil and is disposed not to overlap with at least two of the first magnet, the second magnet, and the third magnet, when viewed above the second surface.

15. An electronic device, comprising:
a housing comprising:
a first surface facing a first direction,
a second surface facing a second direction opposite to the first direction, and
a side member configured to enclose at least a portion of a space between the first surface and the second surface;
a receiver positioned inside the housing;
a display positioned inside the housing and exposed through at least a portion of the first surface; and
a processor positioned inside the housing and electrically connected to the receiver and the display,
wherein the receiver comprises:
a coil,
a first magnet disposed inside the coil to emit a magnetic flux in the first direction or the second direction,
a second magnet disposed outside the coil,
a third magnet disposed outside the coil to be symmetric to the second magnet, and
a shield structure made of a conductive material, and
wherein the shield structure comprises:
a first shield structure formed in the first direction or the second direction, and
a second shield structure extended from the first shield structure in a substantially vertical direction to the first direction or the second direction and disposed not to overlap with the coil and the magnets, when viewed above the second surface.

16. The electronic device of claim 15, wherein the second shield structure is extended from the first shield structure to be bent in a substantially vertical direction to one side surface of the housing.

17. The electronic device of claim 15, wherein the receiver is exposed through the first surface.

18. An electronic device, comprising:
a receiver comprising:
an actuator including:
a plurality of magnets, and
a coil,
a first surface facing a first direction, and
a second surface facing a second direction vertical to the first direction; and
a shield structure comprising:
a first shield structure formed in at least a portion of the first surface of the receiver, and
a second shield structure formed in at least a portion of the second surface, the second shield structure being extended from the first shield structure,
wherein the second shield structure is overlapped with at least one magnet, among the plurality of magnets, or the second shield is not overlapped with any one of the plurality of magnets, when viewed above the second surface in the second direction, and
wherein the second shield structure is not overlapped with the coil, when viewed above the second surface in the second direction.

19. The electronic device of claim 18, wherein the second shield structure is extended from the first shield structure to be bent in a substantially vertical direction to the first surface or the second surface.

20. The electronic device of claim 18, wherein the receiver is exposed through the first surface.

* * * * *